(12) United States Patent
Hirasaki

(10) Patent No.: US 12,527,058 B2
(45) Date of Patent: Jan. 13, 2026

(54) SEMICONDUCTOR DEVICE AND METHOD FOR MANUFACTURING SEMICONDUCTOR DEVICE

(71) Applicant: SUMITOMO ELECTRIC INDUSTRIES, LTD., Osaka (JP)

(72) Inventor: Takahide Hirasaki, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 385 days.

(21) Appl. No.: 18/361,175

(22) Filed: Jul. 28, 2023

(65) Prior Publication Data

US 2024/0128326 A1 Apr. 18, 2024

(30) Foreign Application Priority Data

Oct. 12, 2022 (JP) .................................. 2022-163959

(51) Int. Cl.
*H10D 62/85* (2025.01)
*H01L 21/02* (2006.01)
*H01L 21/3065* (2006.01)
*H10D 30/47* (2025.01)
*H10D 64/27* (2025.01)

(52) U.S. Cl.
CPC ... *H10D 62/8503* (2025.01); *H01L 21/02458* (2013.01); *H01L 21/3065* (2013.01); *H10D 30/47* (2025.01); *H10D 64/311* (2025.01)

(58) Field of Classification Search
CPC .. H10D 62/8503; H10D 30/47; H10D 64/311; H10D 30/472; H10D 30/475; H10D 30/015; H10D 62/151; H10D 62/161; H10D 62/85; H10D 64/62; H10D 62/124; H01L 21/02458; H01L 21/3065; H01L 21/02378; H01L 21/02505; H01L 21/0254;

(Continued)

(56) References Cited

U.S. PATENT DOCUMENTS

2019/0165130 A1* 5/2019 Yoshida .............. H01L 21/3086
2019/0194796 A1 6/2019 Fujioka et al.
2025/0022933 A1* 1/2025 Kawashima ......... H10D 64/411

FOREIGN PATENT DOCUMENTS

WO 2005/119787 12/2005
WO 2018/042792 3/2018

* cited by examiner

*Primary Examiner* — Sue A Purvis
*Assistant Examiner* — Carnell Hunter, III
(74) *Attorney, Agent, or Firm* — IPUSA, PLLC

(57) ABSTRACT

A method for manufacturing a semiconductor device includes forming a first insulating layer on a first nitride semiconductor layer having a principal surface, forming a mask including a first mask opening on the first insulating layer, forming a first opening in the first insulating layer through the first mask opening, forming a second nitride semiconductor layer on the first nitride semiconductor layer inside the first opening, forming a second insulating layer covering a boundary between the second nitride semiconductor layer and the first insulating layer through the first mask opening and thereafter removing the mask, forming a second opening in the second insulating layer, forming a first electrode on the second insulating layer contacting the second nitride semiconductor layer through the second opening, and forming a gate electrode above the first nitride semiconductor layer, and separated from the second insulating layer in a plan view perpendicular to the principal surface.

8 Claims, 26 Drawing Sheets

(58) Field of Classification Search
CPC ......... H01L 21/02576; H01L 21/02639; H01L 21/3081; H01L 21/31144
See application file for complete search history.

SEMICONDUCTOR DEVICE AND METHOD FOR MANUFACTURING SEMICONDUCTOR DEVICE

CROSS-REFERENCE TO RELATED APPLICATIONS

This application is based upon and claims priority to Japanese Patent Application No. 2022-163959, filed on Oct. 12, 2022, the entire contents of which are incorporated herein by reference.

TECHNICAL FIELD

The present disclosure relates to semiconductor devices, and methods for manufacturing semiconductor devices.

BACKGROUND

In order to reduce an on resistance in a semiconductor device using a nitride semiconductor, a proposed structure has a regrown nitride semiconductor layer including an impurity at a high concentration.

Related art includes International Publication Pamphlet No. WO 2005/119787 A1, and International Publication Pamphlet No. WO 2018/042792 A1, for example.

In the conventional semiconductor device, a surface of the regrown nitride semiconductor layer may be damaged during a manufacturing process.

SUMMARY

According to one aspect of the embodiments, a method for manufacturing a semiconductor device includes forming a first insulating layer on a first nitride semiconductor layer having a first principal surface; forming, on the first insulating layer, a mask including a first mask opening through which a portion of the first insulating layer is exposed; forming a first opening in the first insulating layer through the first mask opening, to expose a portion of the first nitride semiconductor layer; forming a second nitride semiconductor layer on the first nitride semiconductor layer inside the first opening, through the first mask opening; forming a second insulating layer covering a boundary line between the second nitride semiconductor layer and the first insulating layer, through the first mask opening; removing the mask after the forming the second insulating layer; forming a second opening in the second insulating layer, to expose a portion of the second nitride semiconductor layer; forming a first electrode on the second insulating layer, making contact with the second nitride semiconductor layer through the second opening; and forming a gate electrode above the first nitride semiconductor layer, at a position separated from the second insulating layer in a plan view perpendicular to the first principal surface.

The object and advantages of the embodiments will be realized and attained by means of the elements and combinations particularly pointed out in the claims.

It is to be understood that both the foregoing general description and the following detailed description are exemplary and explanatory and not restrictive of the invention, as claimed.

DETAILED DESCRIPTION

Figure 1:
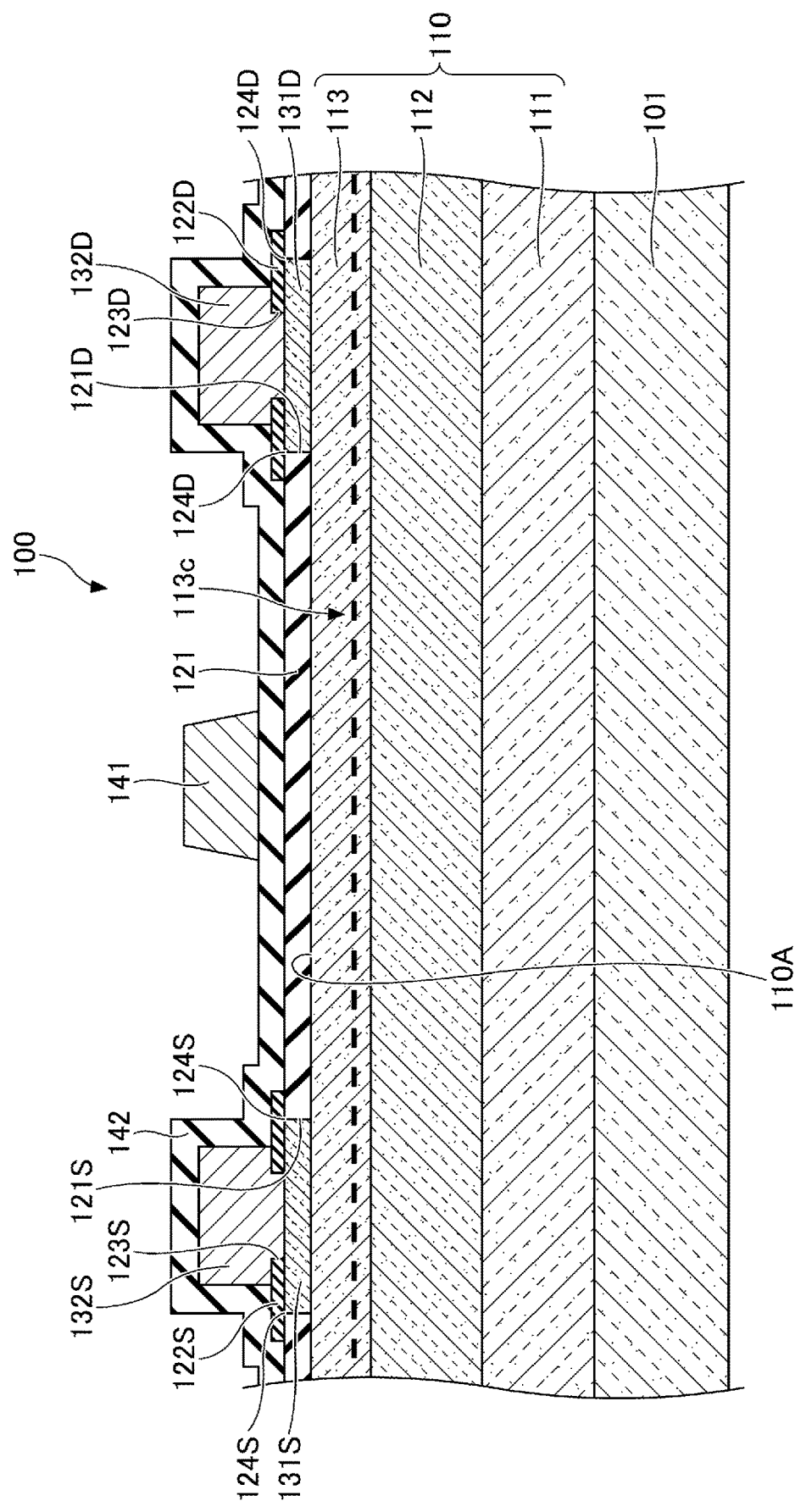
FIG. 1 is a cross sectional view illustrating a semiconductor device according to a first embodiment.

One object of the present disclosure is to provide a semiconductor device and a method for manufacturing the semiconductor device, which can reduce damage to a surface of a regrown nitride semiconductor layer.

DESCRIPTION OF EMBODIMENTS OF THE PRESENT DISCLOSURE

First, embodiments of the present disclosure will be described in the following.

[1] According to one aspect of the present disclosure, a method for manufacturing a semiconductor device includes forming a first insulating layer on a first nitride semiconductor layer having a first principal surface; forming, on the first insulating layer, a mask including a first mask opening through which a portion of the first insulating layer is exposed; forming a first opening in the first insulating layer through the first mask opening, to expose a portion of the first nitride semiconductor layer; forming a second nitride semiconductor layer on the first nitride semiconductor layer inside the first opening, through the first mask opening; forming a second insulating layer covering a boundary line between the second nitride semiconductor layer and the first insulating layer, through the first mask opening; removing the mask after the forming the second insulating layer; forming a second opening in the second insulating layer, to expose a portion of the second nitride semiconductor layer; forming a first electrode on the second insulating layer, making contact with the second nitride semiconductor layer through the second opening; and forming a gate electrode above the first nitride semiconductor layer, at a position separated from the second insulating layer in a plan view perpendicular to the first principal surface.

The second nitride semiconductor layer is covered by the second insulating layer, before removing the mask. The second insulating layer covers the boundary line between the second nitride semiconductor layer and the first insulating layer. Accordingly, the surface of the second nitride semiconductor layer is protected from a chemical that is used to remove the mask, and damage to the surface of the second nitride semiconductor layer can be reduced. In addition, the gate electrode is famed at the position separated from the second insulating layer in the plan view. For this reason, a distance between the gate electrode and the first nitride semiconductor layer is hardly affected by the second insulating layer. Hence, a change in gate controllability from a structure having no second insulating layer can be reduced.

[2] In the method for manufacturing the semiconductor device according to [1] above, the mask may include a second mask opening through which another portion of the first insulating layer is exposed, and the method may further include forming a third opening in the first insulating layer through the second mask opening, to expose another portion of the first nitride semiconductor layer, simultaneously as the forming of the first opening; forming a third nitride semiconductor layer on the first nitride semiconductor layer inside the third opening through the second mask opening, simultaneously as the forming the second nitride semiconductor layer; forming a third insulating layer covering a boundary line between the third nitride semiconductor layer and the first insulating layer through the second mask opening, simultaneously as the forming of the second insulating layer; forming a fourth opening in the third insulating layer, to expose a portion of the third nitride semiconductor layer, simultaneously as the forming the second opening; and forming a second electrode on the third insulating layer, making contact with the third nitride semiconductor layer through the fourth opening, simultaneously as the forming the first electrode. In this case, the first electrode and the second electrode can be used as a source electrode and a drain electrode of a field effect transistor.

[3] In the method for manufacturing the semiconductor device according to [2] above, the gate electrode may be formed between the second insulating layer and the third insulating layer in the plan view. In this case, the distance between the gate electrode and the first nitride semiconductor layer is hardly affected by the third insulating layer.

[4] The method for manufacturing the semiconductor device according to [2] or [3] above may further include forming a fourth insulating layer on the first insulating layer and covering the first electrode, between the forming the first electrode and the forming the gate electrode, wherein the gate electrode is formed on the fourth insulating layer. In this case, a so-called metal insulator semiconductor (MIS) structure can be formed.

[5] In the method for manufacturing the semiconductor device according to [4] above, an upper surface of the second nitride semiconductor layer may be an N-polar surface. In this case, a low resistance can be achieved with ease.

[6] The method for manufacturing the semiconductor device according to [4] above may further include forming a fifth opening in the fourth insulating layer and the first insulating layer, between the forming the fourth insulating layer and the forming the gate electrode, wherein the gate electrode is famed to make contact with the first nitride semiconductor layer through the fifth opening. In this case, a so-called metal semiconductor (MES) structure can be formed.

[7] In the method for manufacturing the semiconductor device according to [6] above, an upper surface of the second nitride semiconductor layer may be a Ga-polar surface. In this case, an excellent etching resistance can easily be obtained at the upper surface of the second nitride semiconductor layer.

[8] According to another aspect of the present disclosure, a semiconductor device includes a first nitride semiconductor layer having a first principal surface; a first insulating layer provided on the first nitride semiconductor layer and having a first opening exposing a portion of the first nitride semiconductor layer; a second nitride semiconductor layer provided on the first nitride semiconductor layer inside the first opening; a second insulating layer covering a boundary line between the second nitride semiconductor layer and the first insulating layer, and having a second opening exposing a portion of the second nitride semiconductor layer; an electrode provided on the second insulating layer and making contact with the second nitride semiconductor layer through the second opening; and a gate electrode provided above the first nitride semiconductor layer, and separated from the second insulating layer in a plan view perpendicular to the first principal surface. In this case, damage to the surface of the second nitride semiconductor layer can be reduced by the second insulating layer. In addition, the distance between the gate electrode and the first nitride semiconductor layer is hardly affected by the second insulating layer, and a change in gate controllability from a structure having no second insulating layer can be reduced.

DETAILS OF EMBODIMENTS OF THE PRESENT DISCLOSURE

Hereinafter, embodiments of the present disclosure will be described in detail, but the present disclosure is not limited thereto. In the present specification and the drawings, constituent elements having substantially the same functional configuration are designated by the same reference numerals, and a description thereof may be omitted.

First Embodiment

First, a first embodiment will be described. The first embodiment relates to a semiconductor device including a GaN-based high electron mobility transistor (HEMT). FIG. 1 is a cross sectional view illustrating the semiconductor device according to the first embodiment.

As illustrated in FIG. 1, a semiconductor device 100 according to the first embodiment includes, among other things, a substrate 101, a nitride semiconductor layer 110, an insulating layer 121, an insulating layer 122S, an insulating layer 122D, an n-type GaN layer 131S, an n-type GaN layer 131D, a gate electrode 141, a source electrode 132S, a drain electrode 132D, and an insulating layer 142.

The substrate 101 can be a substrate for growing thereon a GaN-based semiconductor, for example, and an example of the substrate 101 includes a semi-insulating SiC substrate, for example. In a case where the substrate 101 is a SiC substrate, a surface of the substrate 101 is a carbon polar (C-polar) surface. In a case where the surface of the substrate 101 is a C-polar surface, crystal growth of the nitride semiconductor layer 110 can occur using a nitrogen polar (N-polar) surface as a growth surface. A sapphire substrate can also be used as the substrate for growing thereon the GaN-based semiconductor. The substrate 101 can be a substrate that is not for causing the crystal growth thereon. In this case, another substrate can be removed from a laminate having a buffer layer 111, a barrier layer 112, and a channel layer 113 successively grown on this other substrate, and the substrate 101 can be bonded to the laminate, removed of this other substrate, and having the buffer layer 111, the barrier layer 112, and the channel layer 113. In this case, a semi-insulating substrate made of various materials can be used as the substrate 101. Examples of the semi-insulating substrate include a sapphire substrate, a Si substrate, a SiC substrate, a AlN substrate, a sintered body, or the like, for example.

The nitride semiconductor layer 110 includes the buffer layer 111, the barrier layer 112, and the channel layer 113. The nitride semiconductor layer 110 is an example of a first nitride semiconductor layer.

The buffer layer 111 can be a AlN layer, for example. The AlN layer has a thickness in a range greater than or equal to 5 nm and less than or equal to 100 nm, for example. The buffer layer 111 can include a AlN layer, and a GaN layer or a AlGaN layer on the AlN layer. The GaN layer or the AlGaN layer has a thickness in a range greater than or equal to 300 nm and less than or equal to 2000 nm, for example.

The barrier layer 112 can be a AlGaN layer, for example. A band gap of the barrier layer 112 is larger than a band gap of the channel layer 113 which will be described later. The barrier layer 112 has a thickness in a range greater than or equal to 5 nm and less than or equal to 50 nm, for example, and is 30 nm in one embodiment. In a case where the barrier layer 112 is a $Al_xGa_{1-x}N$ layer, a Al composition x thereof is in a range greater than or equal to 0.15 and less than or equal to 0.55, for example, and is 0.35 in one embodiment. A conductivity type of the barrier layer 112 is a n-type or a i-type (undoped), for example. A InAlN layer or a InAlGaN layer can be used in place of the AlGaN layer.

The channel layer 113 can be a GaN layer, for example. A band gap of the channel layer 113 is smaller than the band gap of the barrier layer 112. The channel layer 113 has a thickness in a range greater than or equal to 5 nm and less than or equal to 30 nm, for example, and is 9 nm in one embodiment. A strain is generated between the channel layer 113 and the barrier layer 112 due to a difference between lattice constants thereof, and this strain induces a piezoelectric charge at an interface between the channel layer 113 and the barrier layer 112. Hence, a two dimensional electron gas (2DEG) is generated in a region inside the channel layer 113, on a side closer to the barrier layer 112, to thereby form a channel region 113c. The conductivity type of the channel layer 113 is the n-type or the i-type (undoped), for example. A surface of the channel layer 113 forms a surface 110A of the nitride semiconductor layer 110. In addition, a spacer layer can be formed between the barrier layer 112 and the channel layer 113. The spacer layer can be a AlN layer, for example. The spacer layer has a thickness in a range greater than or equal to 0.5 nm and less than or equal to 3.0 nm, for example, and is 1.0 nm in one embodiment. The surface 110A is an example of a first principal surface.

On the C-polar surface of the SiC substrate, crystal growth of the buffer layer 111, the barrier layer 112, and the channel layer 113 can occur using the N-polar surface as a growth surface. Accordingly, the surface of each of the buffer layer 111, the barrier layer 112, and the channel layer 113 becomes the N-polar surface, and a back surface of each of the buffer layer 111, the barrier layer 112, and the channel layer 113 on the opposite side becomes a gallium polar (Ga-polar) surface.

The insulating layer 121 makes contact with the surface 110A of the nitride semiconductor layer 110. The insulating layer 121 can be a silicon nitride (SiN) layer, for example. The insulating layer 121 has a thickness in a range greater than or equal to 20 nm and less than or equal to 80 nm, for example. Openings 121S and 121D are formed in the insulating layer 121. A portion of the nitride semiconductor layer 110 is exposed through the opening 121S, and another portion of the nitride semiconductor layer 110 is exposed through the opening 121D. The insulating layer 121 is an example of a first insulating layer. The openings 121S and 121D are examples of a first opening or a third opening.

The n-type GaN layer 131S is formed on the nitride semiconductor layer 110 inside the opening 121S. The n-type GaN layer 131D is formed on the nitride semiconductor layer 110 inside the opening 121D. The n-type GaN layers 131S and 131D include Ge or Si as an n-type impurity. The n-type GaN layers 131S and 131D are examples of a second nitride semiconductor layer or a third nitride semiconductor layer.

The insulating layer 122S is formed on the n-type GaN layer 131S and the insulating layer 121. The insulating layer 122S can be a silicon nitride (SiN) layer, for example. The insulating layer 122S has a thickness in a range greater than or equal to 20 nm and less than or equal to 50 nm, for example. The insulating layer 122S makes contact with a boundary line 124S between the n-type GaN layer 131S and the insulating layer 121, and covers the boundary line 124S between the n-type GaN layer 131S and the insulating layer 121. The boundary line 124S is a line forming an interface between the n-type GaN layer 131S and the insulating layer 121, and is located at an end portion of the interface separated from the nitride semiconductor layer 110. An opening 123S, exposing a portion of the n-type GaN layer 131S, is famed in the insulating layer 122S.

The insulating layer 122D is formed on the n-type GaN layer 131D and the insulating layer 121. The insulating layer 122D can be a silicon nitride (SiN) layer, for example. The insulating layer 122D has a thickness in a range greater than or equal to 20 nm and less than or equal to 50 nm, for example. The insulating layer 122D is separated from the insulating layer 122S. The insulating layer 122D makes contact with a boundary line 124D between the n-type GaN layer 131D and the insulating layer 121, and covers the boundary line 124D between the n-type GaN layer 131D and the insulating layer 121. The boundary line 124D is a line forming an interface between the n-type GaN layer 131D and the insulating layer 121, and is located at an end portion of the interface separated from the nitride semiconductor layer 110. An opening 123D, exposing a portion of the n-type GaN layer 131D, is formed in the insulating layer 122D. The insulating layers 122S and 122D are examples of a second insulating layer or a third insulating layer. The openings 123S and 123D are examples of a second opening or a fourth opening.

The source electrode 132S is formed on the insulating layer 122S, and the drain electrode 132D is formed on the insulating layer 122D. The source electrode 132S makes contact with the n-type GaN layer 131S through the opening 123S, and the drain electrode 132D makes contact with the n-type GaN layer 131D through the opening 123D. The source electrode 132S makes an ohmic contact with the n-type GaN layer 131S, and the drain electrode 132D makes an ohmic contact with the n-type GaN layer 131D. Each of the source electrode 132S and the drain electrode 132D includes a laminate of a Ta film, a Al film, and a Ta film that are successively laminated in this order, for example. Each of the source electrode 132S and the drain electrode 132D can include a laminate of a Ti film, a Al film, and a Ti film that are successively laminated in this order, for example. The source electrode 132S and the drain electrode 132D are examples of a first electrode or a second electrode.

The insulating layer 142 is formed on the insulating layer 121. The insulating layer 142 can be a silicon nitride (SiN) layer, for example. The insulating layer 142 covers the insulating layer 122S, the source electrode 132S, the insulating layer 122D, and the drain electrode 132D. The gate electrode 141 is famed on the insulating layer 142. In the plan view, the gate electrode 141 is located between the insulating layer 122S and the insulating layer 122D. The gate electrode 141 includes a laminate of a Ni film, a Pd film, and a Au film that are successively laminated in this order, for example. The insulating layer 142 is an example of a fourth insulating layer.

Next, a method for manufacturing the semiconductor device 100 according to the first embodiment will be described. FIG. 2 through FIG. 13 are cross sectional views illustrating the method for manufacturing the semiconductor device according to the first embodiment.

Figure 2:
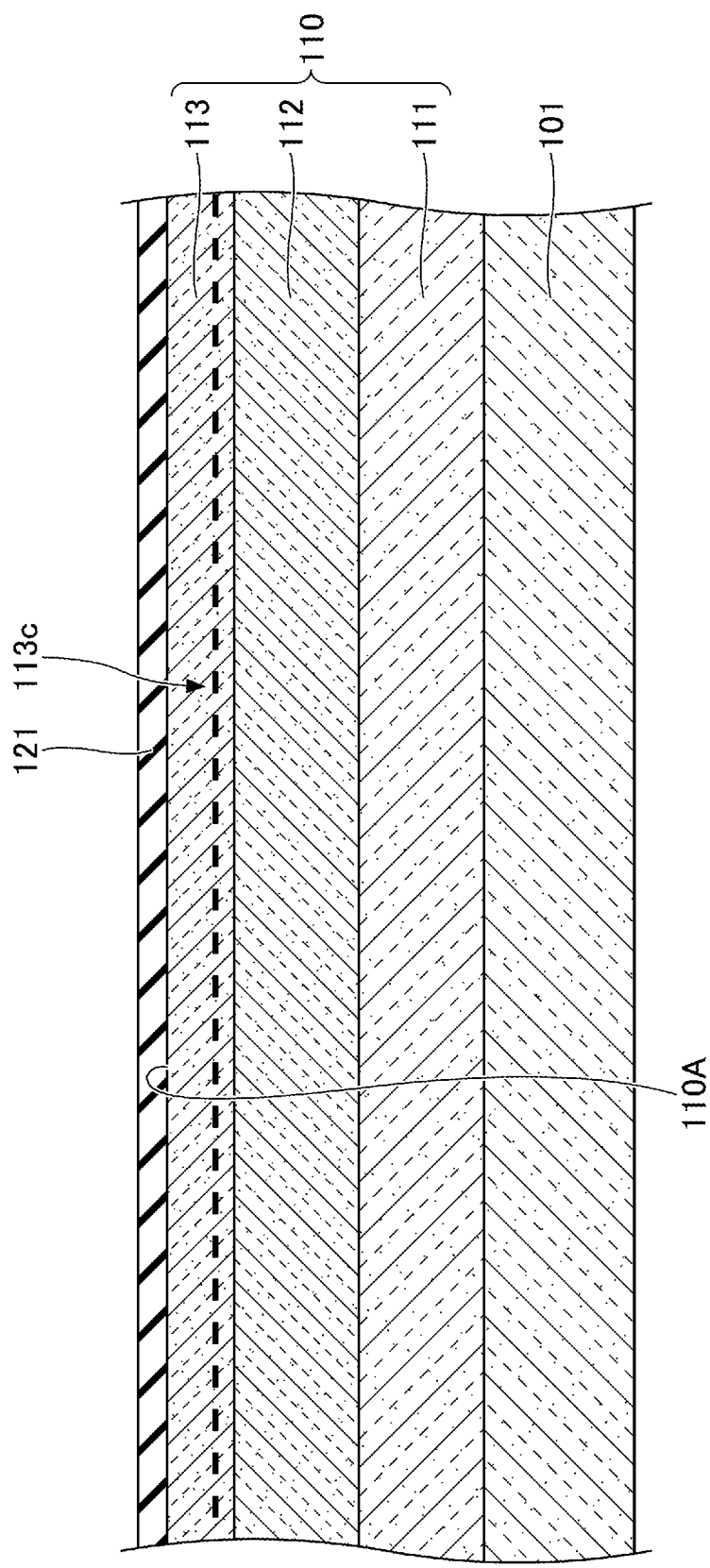
FIG. 2 is a cross sectional view (part 1) illustrating a method for manufacturing the semiconductor device according to the first embodiment.

First, as illustrated in FIG. 2, the nitride semiconductor layer 110 is formed on the substrate 101 by metal organic chemical vapor deposition (MOCVD), for example. When forming the nitride semiconductor layer 110, the buffer layer 111, the barrier layer 112, and the channel layer 113 are successively famed. A strain is generated between the channel layer 113 and the barrier layer 112 due to a difference between lattice constants thereof, and this strain induces a piezoelectric charge at an interface between the channel layer 113 and the barrier layer 112. Hence, the 2DEG is generated in the region inside the channel layer 113, on the side closer to the barrier layer 112, to thereby form the channel region 113c.

Next, the insulating layer 121 is famed to make contact with the surface 110A of the nitride semiconductor layer 110. The insulating layer 121 can be formed by low pressure chemical vapor deposition (LPCVD), for example. The insulating layer 121 can be formed continuously on the buffer layer 111, the barrier layer 112, and the channel layer 113 by MOCVD, for example, without exposing the surface of the channel layer 113 to the atmosphere.

Figure 3:
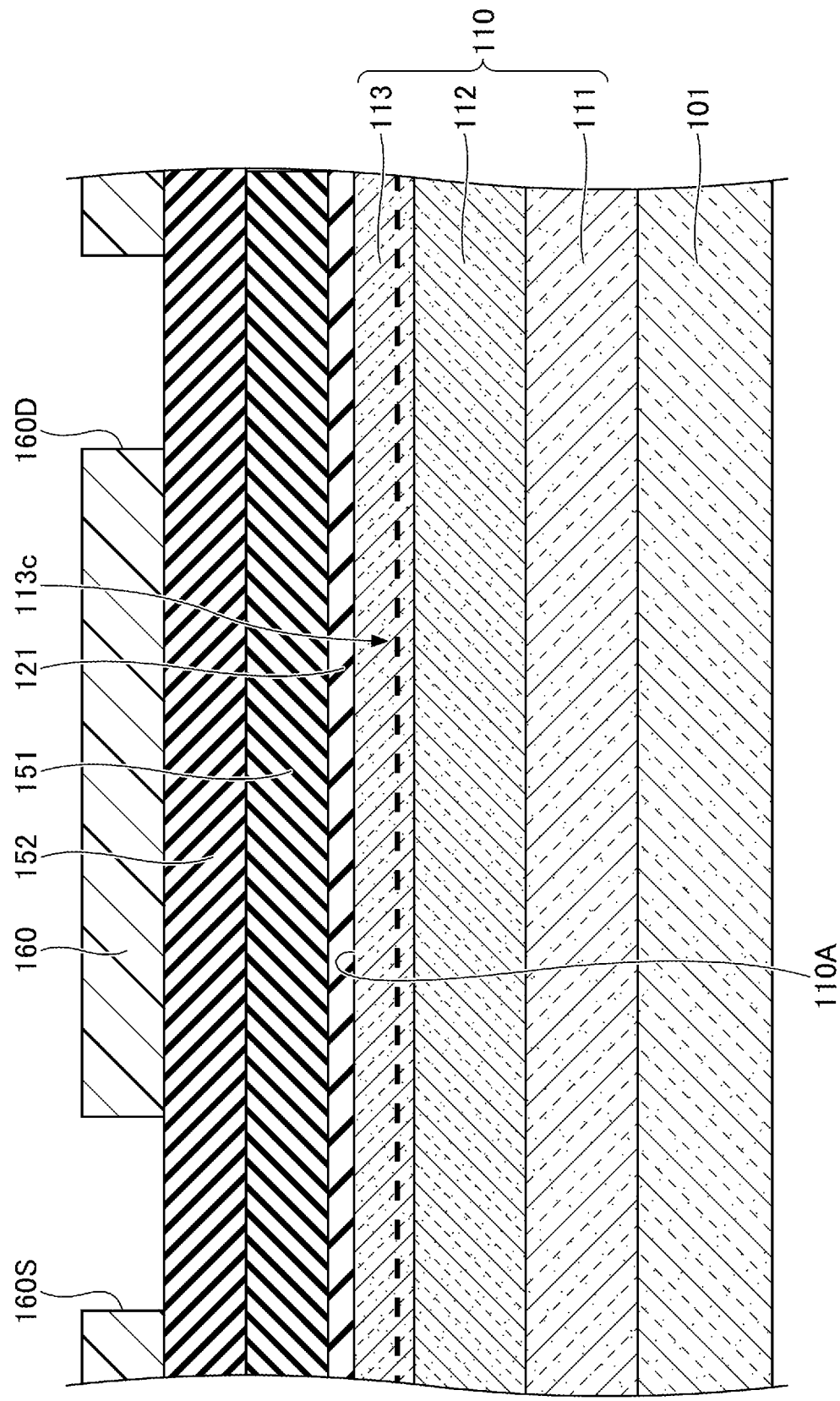
FIG. 3 is a cross sectional view (part 2) illustrating the method for manufacturing the semiconductor device according to the first embodiment.

Next, as illustrated in FIG. 3, a zinc oxide (ZnO) layer 151 is formed on the insulating layer 121. The ZnO layer 151 can be formed by sputtering, for example. The ZnO layer 151 can be famed by a sol-gel method, MOCVD, or molecular beam epitaxy (MBE). Next, an aluminum oxide ($Al_2O_3$) layer 152 is formed on the ZnO layer 151. The $Al_2O_3$ layer 152 can be formed by plasma-enhanced chemical vapor deposition (PECVD), for example. Next, a resist pattern 160 is famed on the $Al_2O_3$ layer 152. The resist pattern 160 has an opening 160S for a source, and an opening 160D for a drain.

Figure 4:
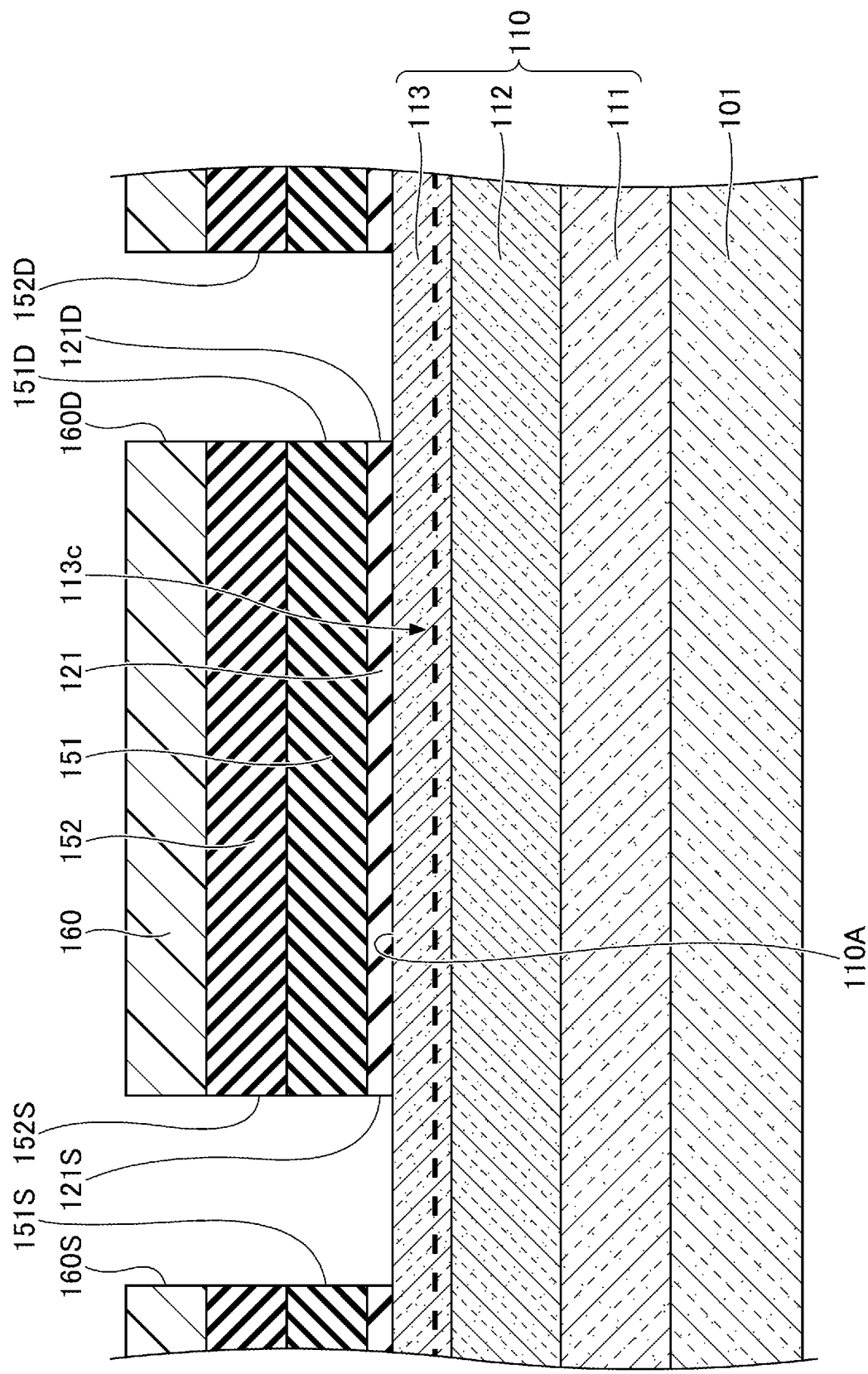
FIG. 4 is a cross sectional view (part 3) illustrating the method for manufacturing the semiconductor device according to the first embodiment.

Next, as illustrated in FIG. 4, the $Al_2O_3$ layer 152, the ZnO layer 151, and the insulating layer 121 are etched using the resist pattern 160 as a mask. This etching can be reactive ion etching (RIE) using a fluorine-based gas or a chlorine-based gas, for example. As a result, under the opening 160S, openings 152S, 151S, and 121S are famed in the $Al_2O_3$ layer 152, the ZnO layer 151, and the insulating layer 121, respectively. In addition, under the opening 160D, openings 152D, 151D, and 121D are formed in the $Al_2O_3$ layer 152, the ZnO layer 151, and the insulating layer 121, respectively. A portion of the nitride semiconductor layer 110 is exposed through the openings 152S, 151S, and 121S, and another portion of the nitride semiconductor layer 110 is exposed through the openings 152D, 151D, and 121D.

Figure 5:
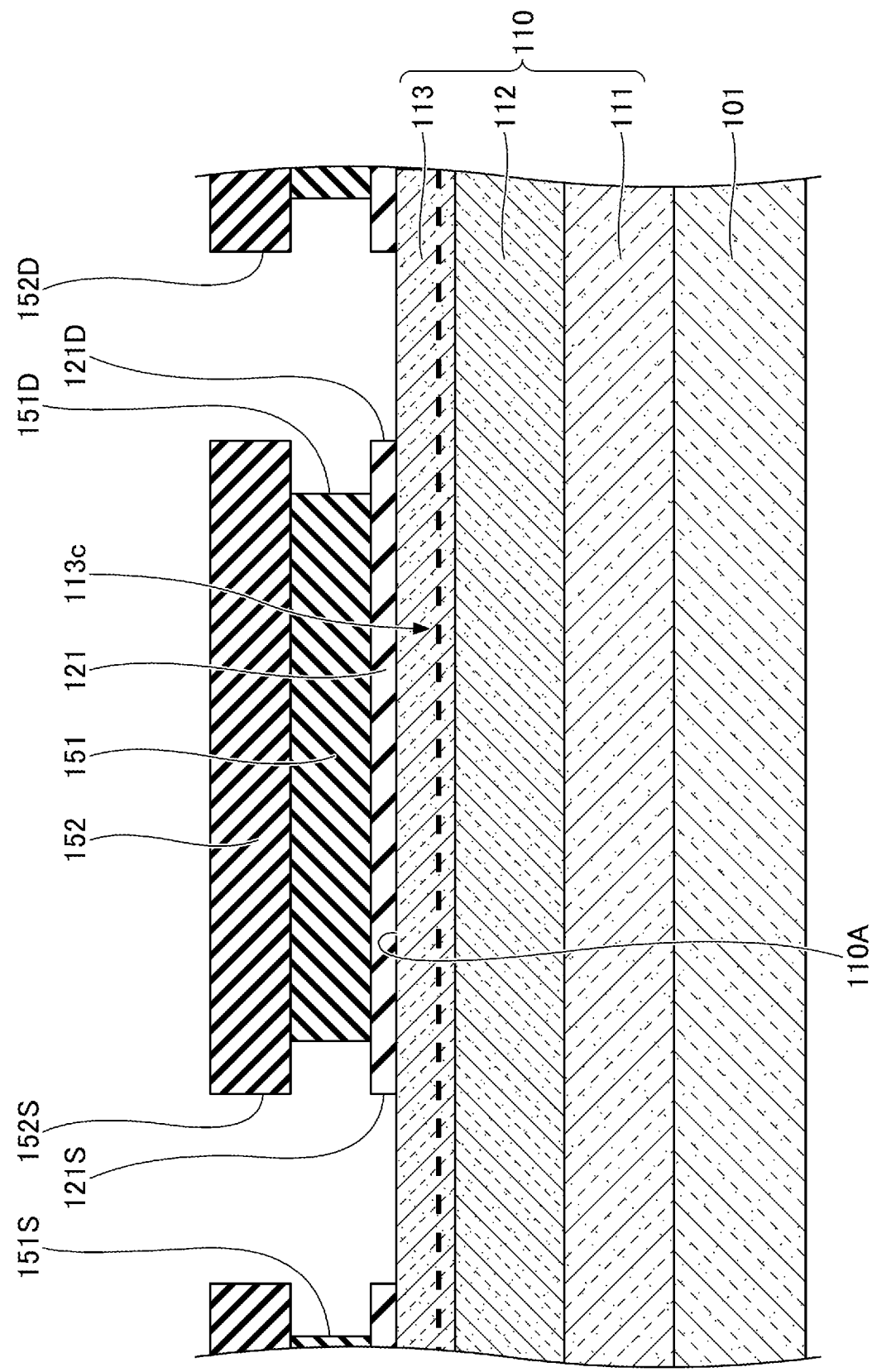
FIG. 5 is a cross sectional view (part 4) illustrating the method for manufacturing the semiconductor device according to the first embodiment.

Next, as illustrated in FIG. 5, the resist pattern 160 is removed by using a chemical, to widen the opening 151S and the opening 151D. As a result, a sidewall surface of the opening 151S recedes more than a sidewall surface of the opening 121S and a sidewall surface of the opening 152S, and a sidewall surface of the opening 151D recedes more than a sidewall surface of the opening 121D and a sidewall surface of the opening 152D.

The $Al_2O_3$ layer 152 formed with the openings 152S and 152D, and the ZnO layer 151 famed with the openings 151S and 151D, can function as a mask when the insulating layer 121 is etched. Accordingly, the resist pattern 160 can be removed before the insulating layer 121 is etched. The $Al_2O_3$ layer 152 formed with the openings 152S and 152D, and the ZnO layer 151 formed with the openings 151S and 151D, are examples of a mask. A combination of the openings 151S and 152S, and a combination of the openings 151D and 152D, are examples of a first mask opening or a second mask opening.

Figure 6:
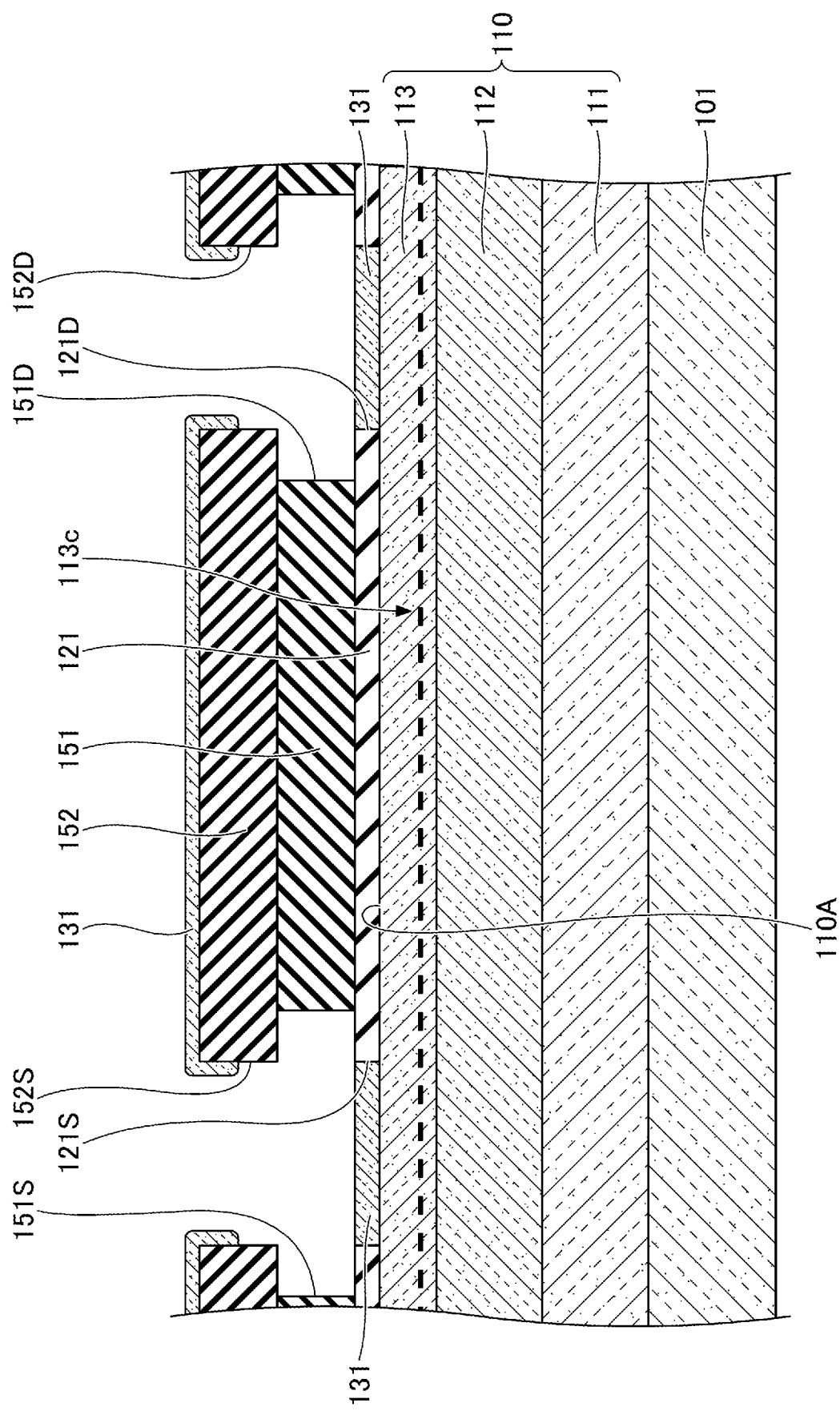
FIG. 6 is a cross sectional view (part 5) illustrating the method for manufacturing the semiconductor device according to the first embodiment.

Next, as illustrated in FIG. 6, the n-type GaN layer 131 is famed on the surface of the nitride semiconductor layer 110 exposed through the openings 152S, 151S, and 121S, and on the surface of the nitride semiconductor layer 110 exposed through the openings 152D, 151D, and 121D. The upper surface of the n-type GaN layer 131 can coincide or not coincide with the upper surface of the insulating layer 121. The n-type GaN layer 131 can be formed by sputtering, MOCVD, MBE, or the like, for example. In this state, the n-type GaN layer 131 is deposited not only on the nitride semiconductor layer 110 but also on the Al$_2$O$_3$ layer 152. For example, a concentration of a n-type dopant is greater than or equal to $1 \times 10^{17}$ cm$^{-3}$, and the n-type dopant can be Si or Ge.

On the N-polar surface of the nitride semiconductor layer 110, crystal growth of the n-type GaN layer 131 occurs using the N-polar surface as a growth surface. Accordingly, on the N-polar surface of the nitride semiconductor layer 110, a surface of the n-type GaN layer 131 becomes a N-polar surface, and a back surface of the n-type GaN layer 131 on the opposite side becomes a Ga-polar surface.

Figure 7:
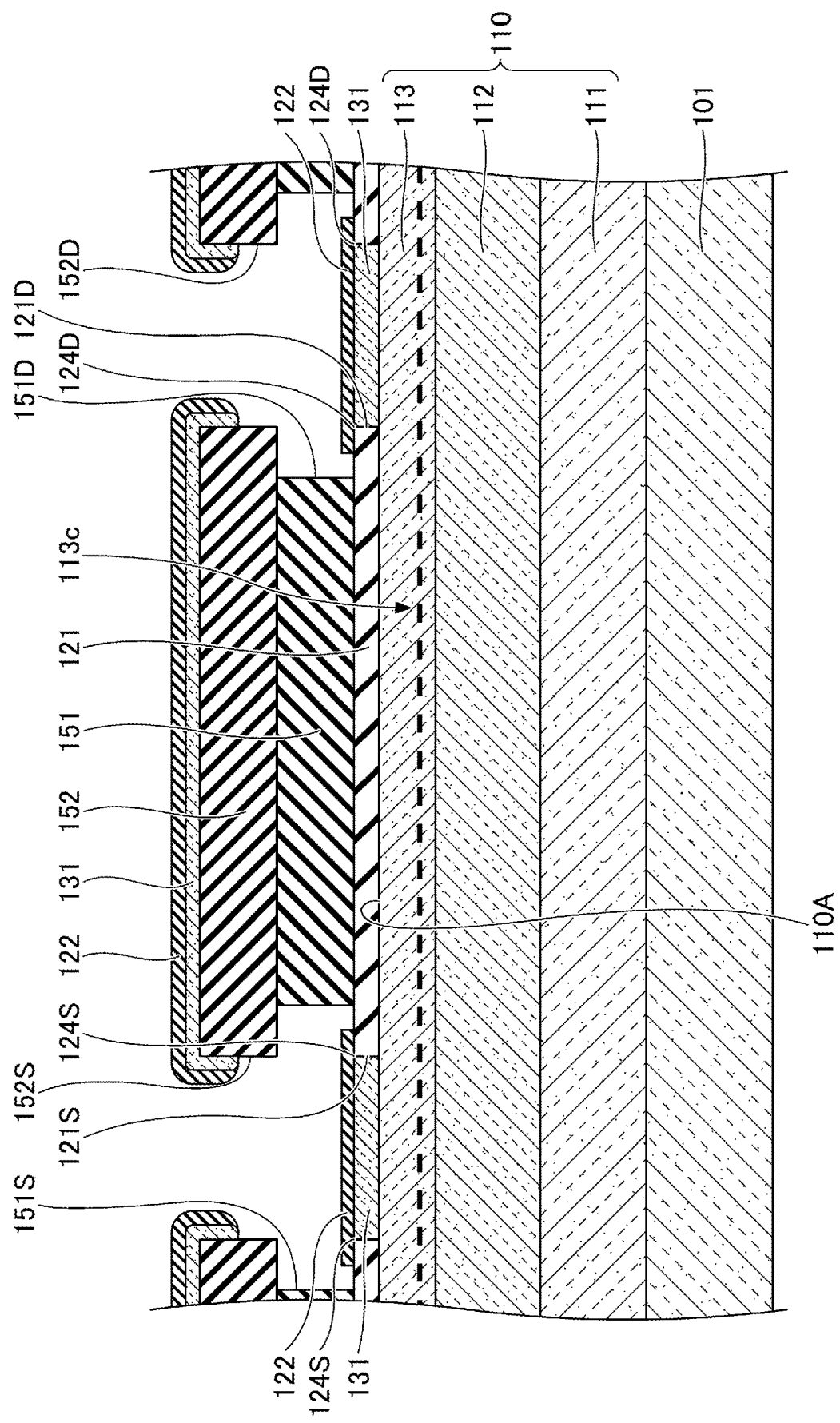
FIG. 7 is a cross sectional view (part 6) illustrating the method for manufacturing the semiconductor device according to the first embodiment.

Next, as illustrated in FIG. 7, the insulating layer 122 is famed on surfaces of the insulating layer 121 and the n-type GaN layer 131 exposed through the openings 152S, 151S, and 121S, and exposed through the openings 152D, 151D, and 121D, respectively. The insulating layer 122 can be a silicon nitride (SiN) layer, for example. The insulating layer 122 has a thickness in a range greater than or equal to 20 nm and less than or equal to 50 nm, for example. The insulating layer 122 is formed so as to cover the boundary line 124S between the n-type GaN layer 131 and the insulating layer 121, and the boundary line 124D between the n-type GaN layer 131 and the insulating layer 121. The insulating layer 122 can be formed by CVD, sputtering, or the like, for example. In this state, the insulating layer 122 is also deposited on the n-type GaN layer 131 on the Al$_2$O$_3$ layer 152.

The n-type GaN layer 131 and the insulating layer 122 can be formed continuously using the same film forming apparatus (or deposition apparatus).

Figure 8:
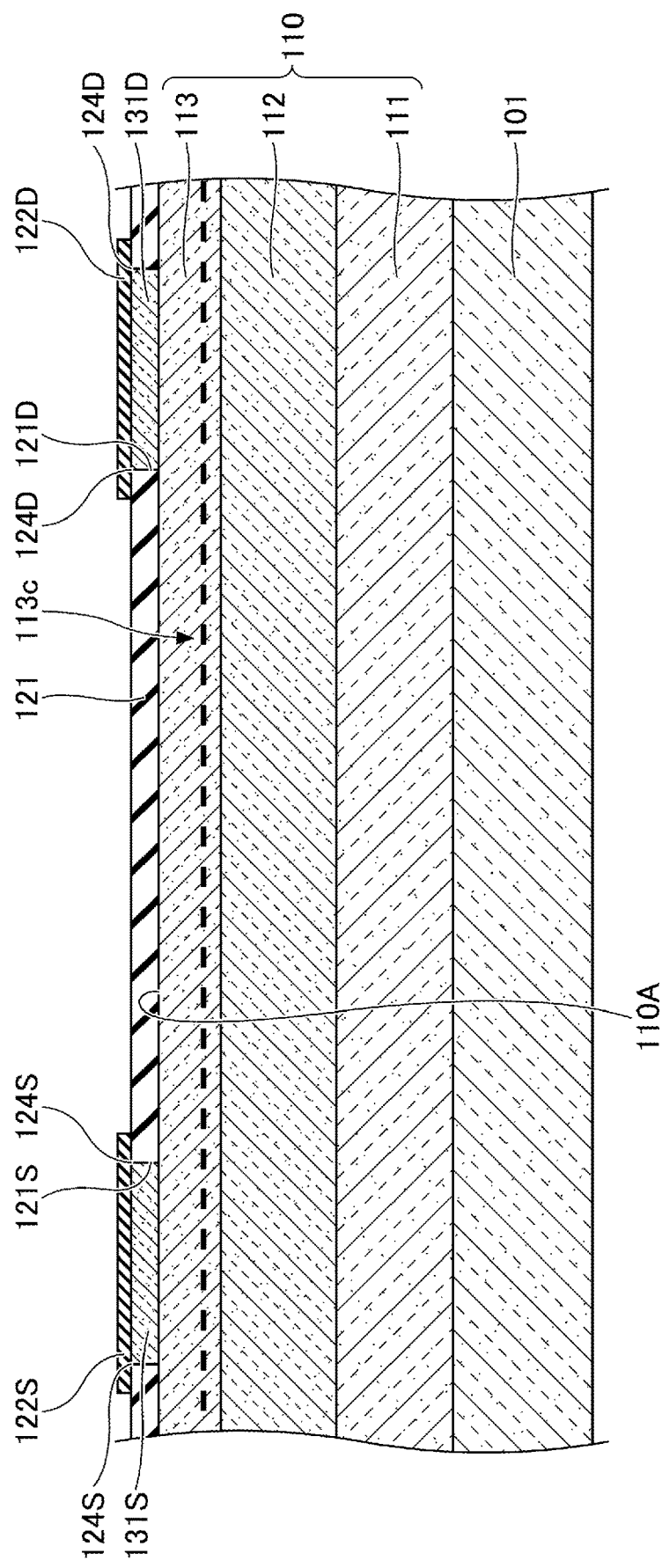
FIG. 8 is a cross sectional view (part 7) illustrating the method for manufacturing the semiconductor device according to the first embodiment.

Next, as illustrated in FIG. 8, the ZnO layer 151 is removed using an acid solution. The acid solution includes hydrochloric acid (HCl) or phosphoric acid (H$_3$PO$_4$), for example. The Al$_2$O$_3$ layer 152, the n-type GaN layer 131, and the insulating layer 122 on the ZnO layer 151 are also removed, along with the removal of the ZnO layer 151. As a result, the n-type GaN layer 131 remains inside the openings 121S and 121D, the n-type GaN layer 131S is formed inside the opening 121S, and the n-type GaN layer 131D is formed inside the opening 121D. In addition, the insulating layer 122 remains on the insulating layer 121 and the n-type GaN layer 131S and on the insulating layer 121 and the n-type GaN layer 131D, the insulating layer 122S is formed on the insulating layer 121 and the n-type GaN layer 131S, and the insulating layer 122D is formed on the insulating layer 121 and the n-type GaN layer 131D.

Figure 9:
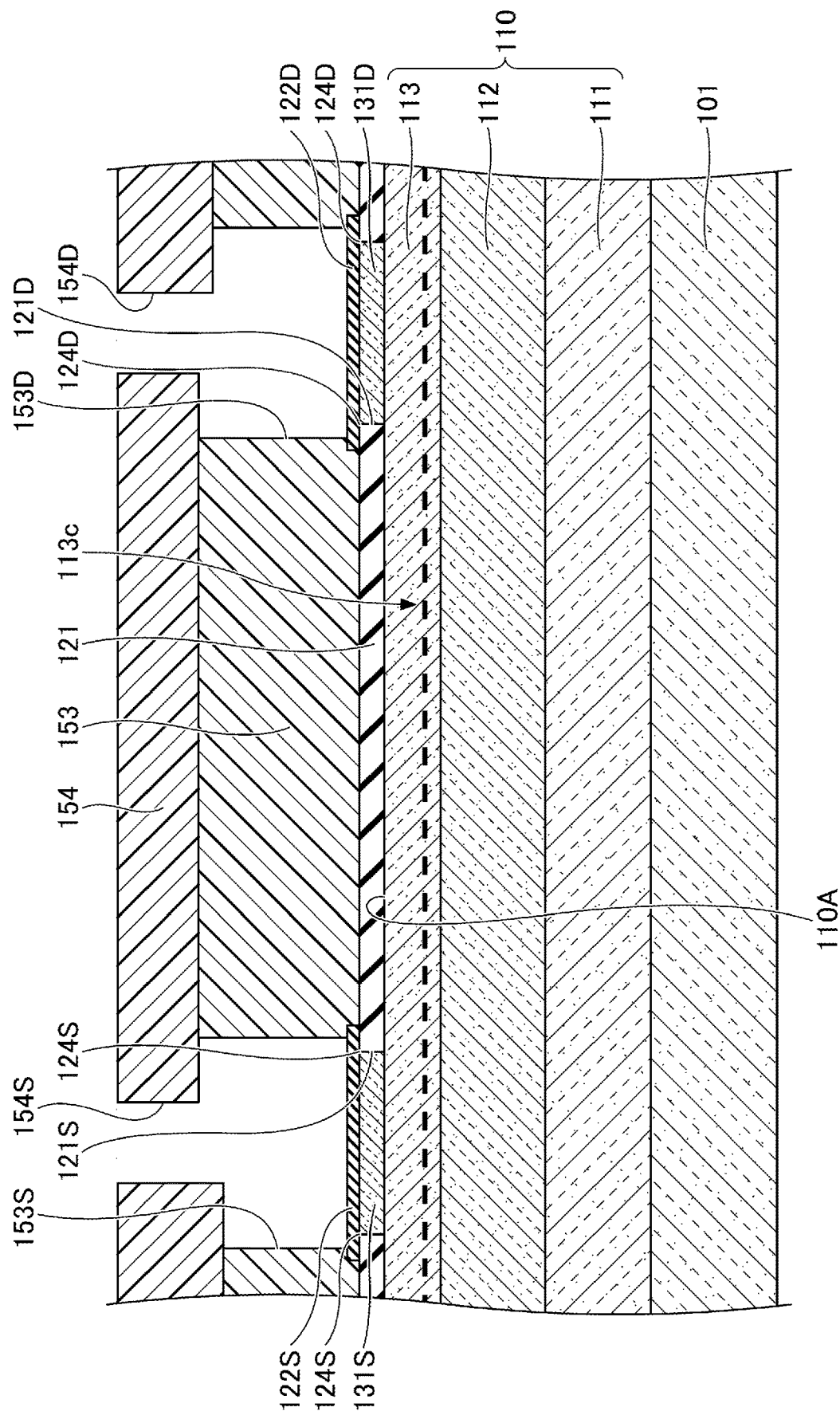
FIG. 9 is a cross sectional view (part 8) illustrating the method for manufacturing the semiconductor device according to the first embodiment.

Next, as illustrated in FIG. 9, a photoresist 153 and a photoresist 154 are coated in this order on the insulating layer 121, the insulating layer 122S, and the insulating layer 122D. For example, a material used for the photoresist 153 is polymethylglutarimide (PMGI), and the photoresist 154 is an i-line resist. Next, a source opening 154S and a drain opening 154D are formed in the photoresist 154 by photolithography, and a source opening 153S and a drain opening 153D are formed in the photoresist 153 by photolithography. A portion of the insulating layer 122S is exposed through the openings 154S and 153S, and a portion of the insulating layer 122D is exposed through the openings 154D and 153D. For example, a lower end of the opening 153S makes contact with an upper surface of the insulating layer 122S, and a lower end of the opening 153D makes contact with an upper surface of the insulating layer 122D.

Figure 10:
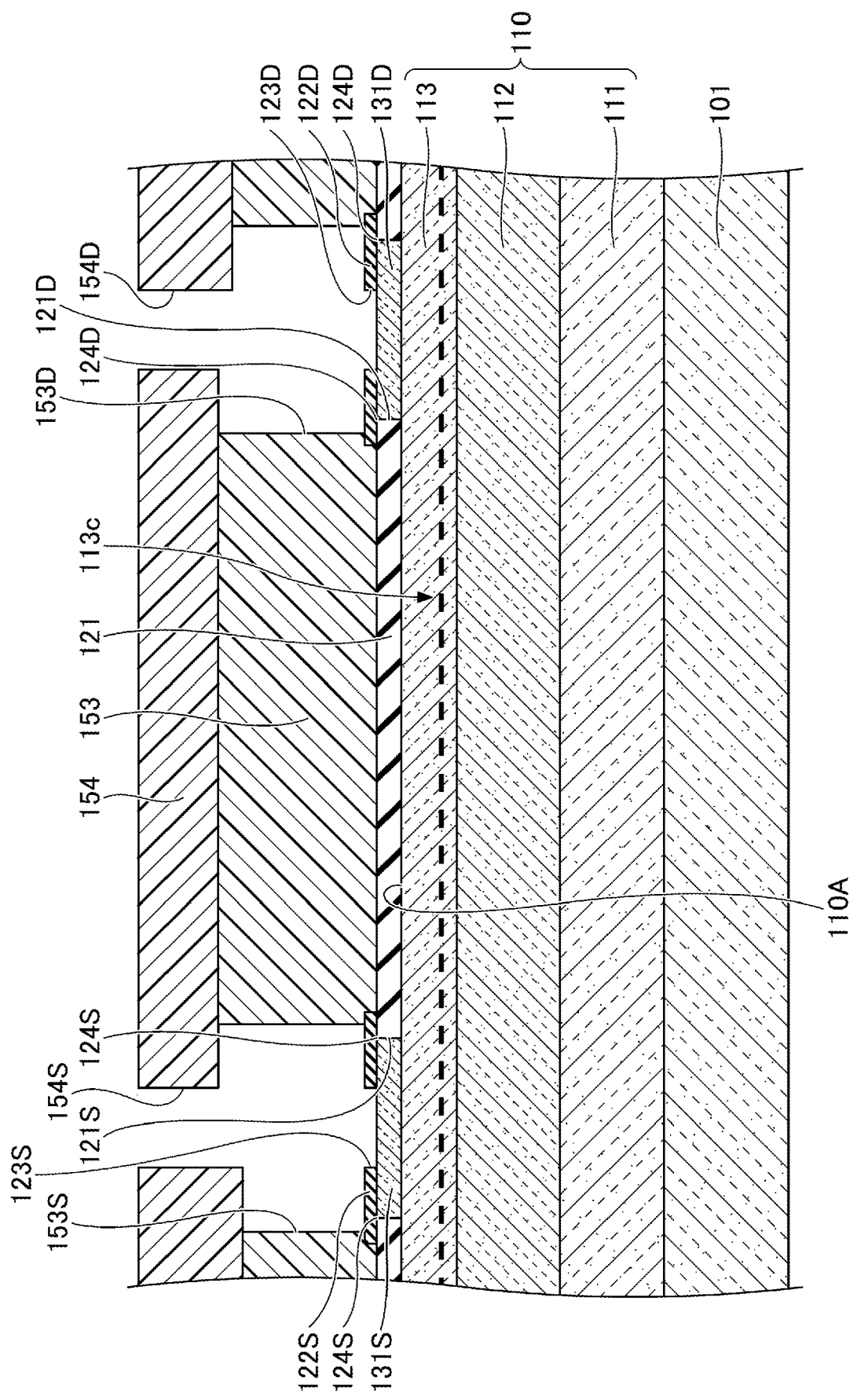
FIG. 10 is a cross sectional view (part 9) illustrating the method for manufacturing the semiconductor device according to the first embodiment.

Next, as illustrated in FIG. 10, the source opening 123S is famed in the insulating layer 122S and the drain opening 123D is formed in the insulating layer 122D, by etching using the photoresists 153 and 154 as masks. This etching can be RIE using a fluorine-based gas, for example. A portion of the n-type GaN layer 131S is exposed through the opening 123S, and a portion of the n-type GaN layer 131D is exposed through the opening 123D.

Figure 11:
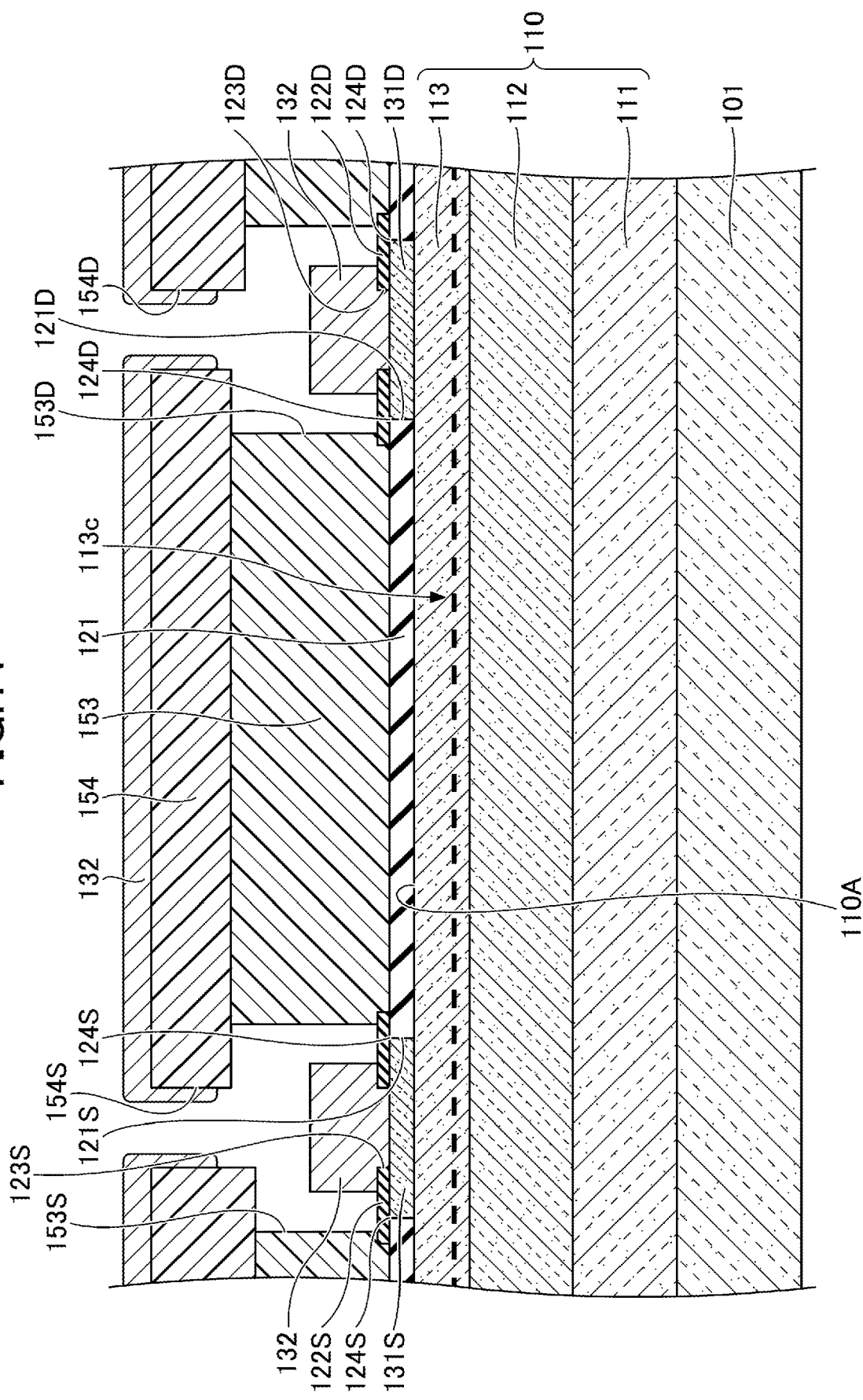
FIG. 11 is a cross sectional view (part 10) illustrating the method for manufacturing the semiconductor device according to the first embodiment.

Next, as illustrated in FIG. 11, a metallic layer 132 is famed on the surfaces of the insulating layer 122S and the n-type GaN layer 131S exposed through the openings 154S and 153S and on the surfaces of the insulating layer 122D and the n-type GaN layer 131D exposed through the openings 154D and 153D. The metallic layer 132 can be formed by a vapor deposition or the like, for example. In this state, the metallic layer 132 is deposited not only on the insulating layer 122S, the n-type GaN layer 131S, the insulating layer 122D, and the n-type GaN layer 131D, but also on the photoresist 154. The metallic layer 132 can include a laminate of a Ta film, a Al film, and a Ta film that are successively laminated in this order, for example. The metallic layer 132 can include a laminate of a Ti film, a Al film, and a Ti film that are successively laminated in this order, for example.

Figure 12:
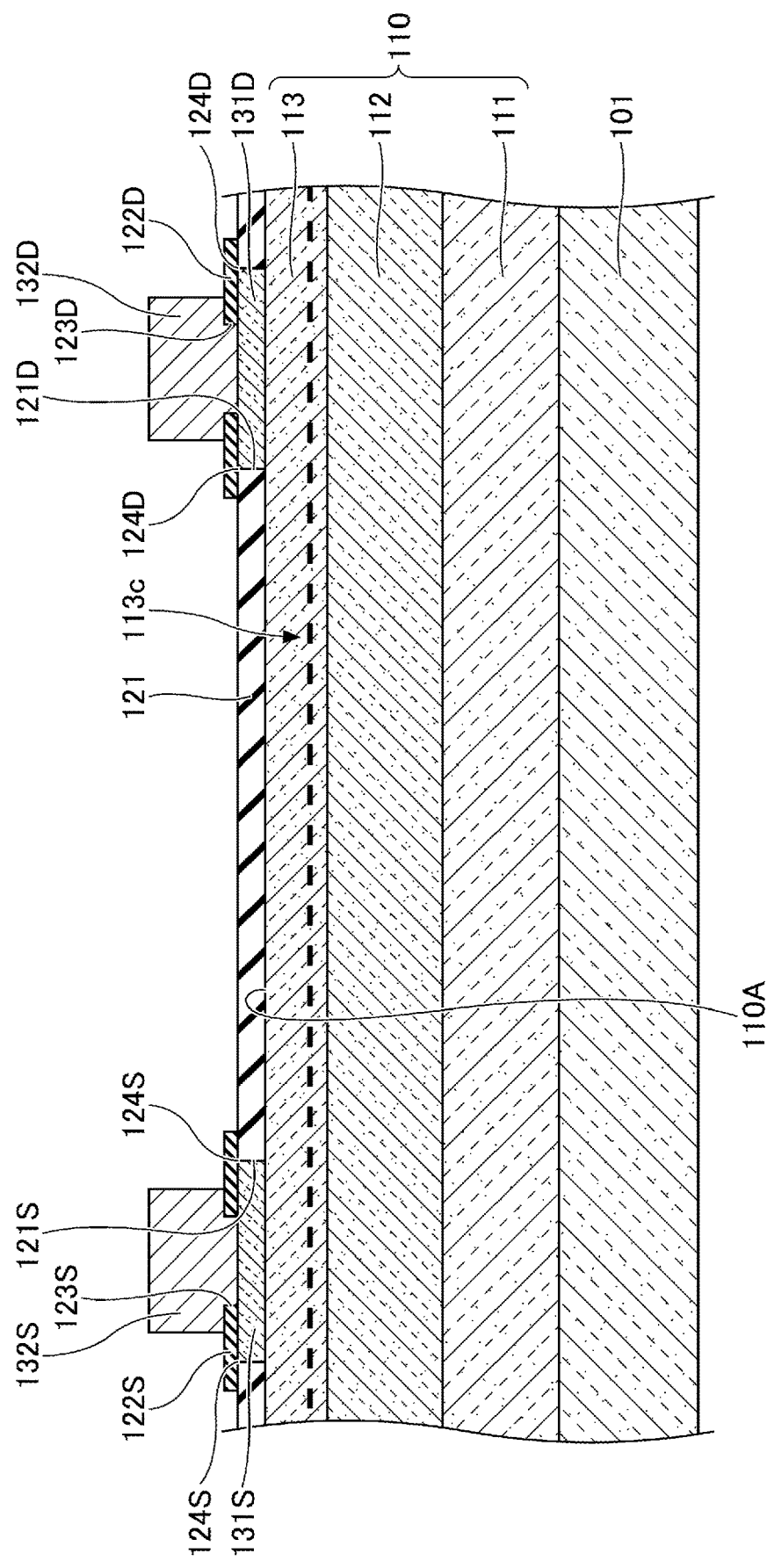
FIG. 12 is a cross sectional view (part 11) depicting the method for manufacturing the semiconductor device in accordance with the first embodiment.

Next, as illustrated in FIG. 12, the photoresists 153 and 154 are removed. The metallic layer 132 on the photoresist 154 is also removed, along with the removal of the photoresist 154. As a result, the metallic layer 132 remains inside the openings 153S and 153D. In other words, a lift-off is performed. Next, the metallic layer 132 is alloyed by a heat treatment. As a result, the source electrode 132S making contact with the n-type GaN layer 131S through the opening 123S is formed on the insulating layer 122S, and the drain electrode 132D making contact with the n-type GaN layer 131D through the opening 123D is famed on the insulating layer 122D. The source electrode 132S makes an ohmic contact with the n-type GaN layer 131S, and the drain electrode 132D makes an ohmic contact with the n-type GaN layer 131D.

Figure 13:
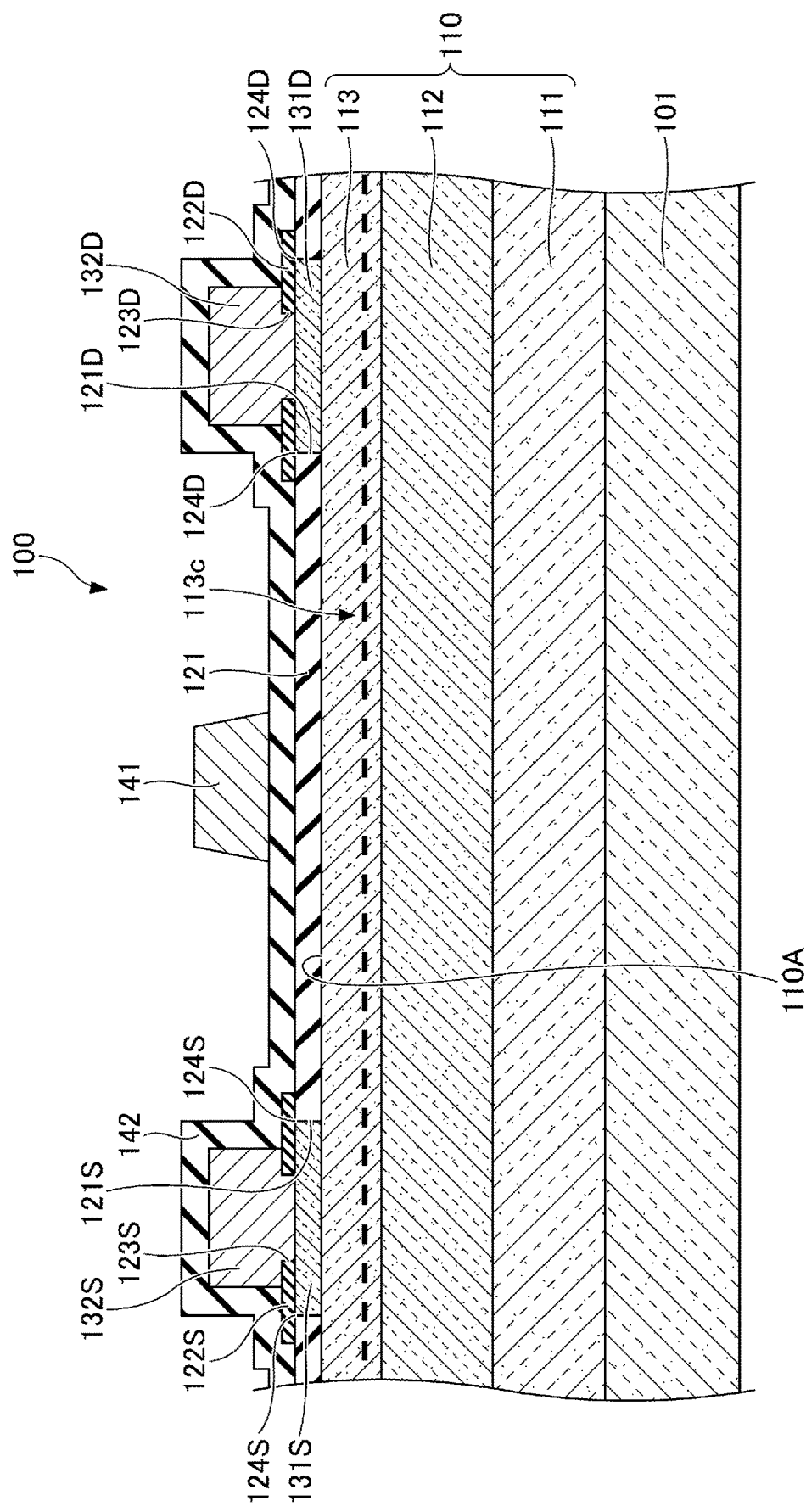
FIG. 13 is a cross sectional view (part 12) illustrating the method for manufacturing the semiconductor device according to the first embodiment.

Next, as illustrated in FIG. 13, the insulating layer 142, covering the insulating layer 122S, the source electrode 132S, the insulating layer 122D, and the drain electrode 132D, is formed on the insulating layer 121. The insulating layer 142 can be famed by plasma CVD or the like, for example. Next, the gate electrode 141 is formed on the insulating layer 142. The gate electrode 141 is formed between the insulating layer 122S and the insulating layer 122D in the plan view. The gate electrode 141 can include a laminate of a Ni film, a Pd film, and a Au film that are successively laminated in this order, for example. When forming the gate electrode 141, a metallic layer is formed using a growth mask (not illustrated) having an opening in a region where the gate electrode 141 is to be formed, for example, and the growth mask is thereafter removed together with the metallic layer (not illustrated) famed thereon. That is, a lift-off is performed.

The semiconductor device 100 can be manufactured in the manner described above.

In the first embodiment, the n-type GaN layers 131S and 131D are covered with the insulating layer 122 before the ZnO layer 151 and the Al$_2$O$_3$ layer 152 serving as the masks are removed. The portion of the insulating layer 122 that becomes the insulating layer 122S makes contact with the boundary line 124S between the n-type GaN layer 131S and the insulating layer 121, and covers the boundary line 124S between the n-type GaN layer 131S and the insulating layer 121. The portion of the insulating layer 122 that becomes the insulating layer 122D makes contact with the boundary line 124D between the n-type GaN layer 131D and the insulating layer 121, and covers the boundary line 124D between the n-type GaN layer 131D and the insulating layer 121. Accordingly, the surfaces of the n-type GaN layers 131S and 131D are protected from the chemical solution used to remove the ZnO layer 151 and the $Al_2O_3$ layer 152, and damage to the surfaces of the n-type GaN layers 131S and 131D can be reduced.

The insulating layers 122S and 122D are separated from the gate electrodes 141 in the plan view perpendicular to the first principal surface. For example, the gate electrode 141 is provided between the insulating layers 122S and 122D in the plan view. For this reason, a distance between the gate electrode 141 and the nitride semiconductor layer 110 is hardly affected by the insulating layers 122S and 122D. Hence, a change in gate controllability from a structure having no insulating layers 122S and 122D can be reduced.

In the first embodiment, the upper surfaces of the n-type GaN layers 131S and 131D are N-polar surfaces, and the channel layer 113 is located above the barrier layer 112. For this reason, a distance between the channel region 113c and each of the source electrode 132S and the drain electrode 132D can be reduced with ease, and it is easy to realize a low resistance.

Moreover, the gate electrode 141 is formed on the insulating layer 142, and does not make contact with the nitride semiconductor layer 110. Hence, the so-called MIS structure can be formed.

Second Embodiment

Figure 14:
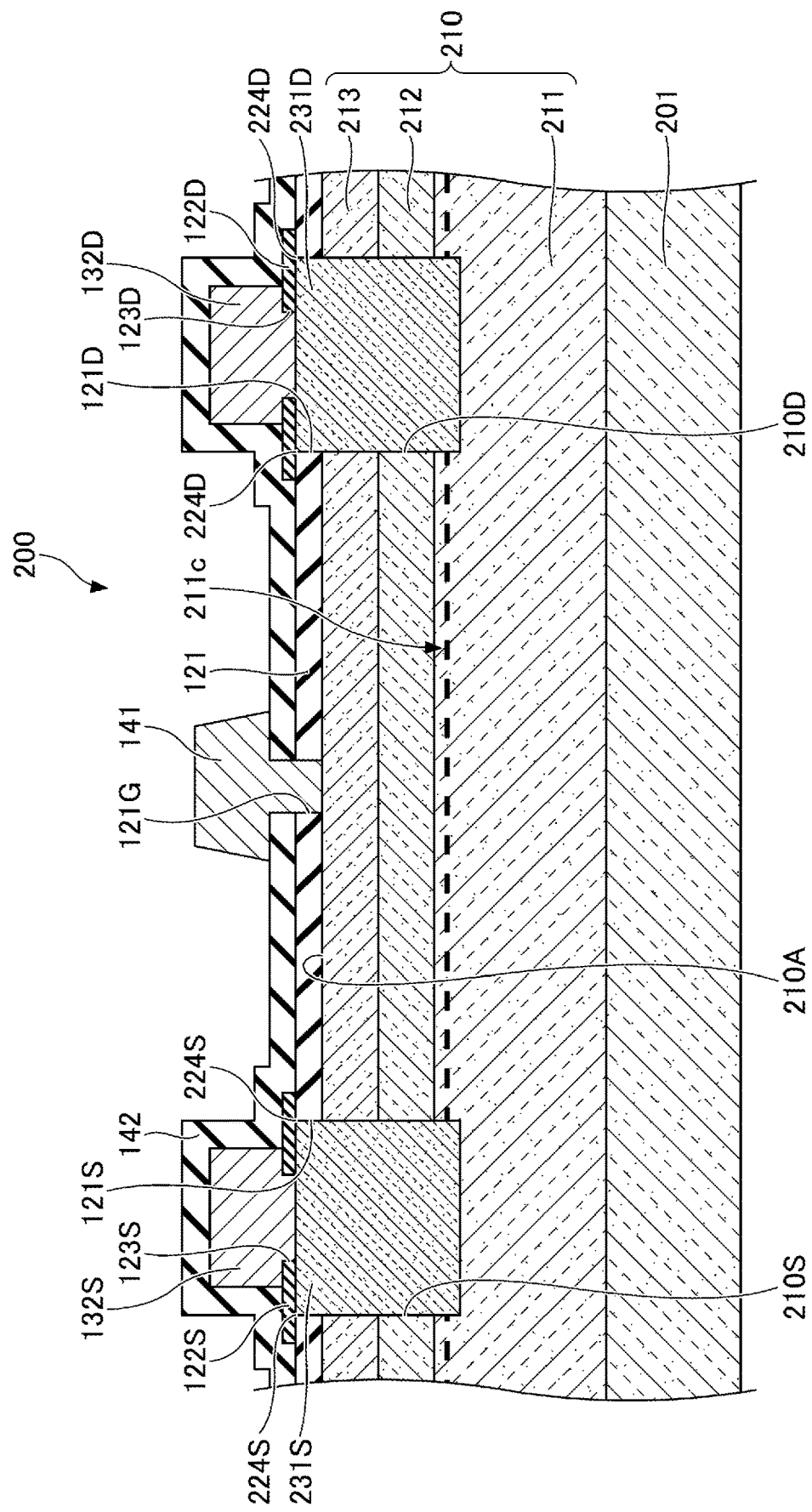
FIG. 14 is a cross sectional view illustrating the semiconductor device according to a second embodiment.

Next, a second embodiment will be described. The second embodiment relates to a semiconductor device including a GaN-based HEMT. FIG. 14 is a cross sectional view illustrating the semiconductor device according to the second embodiment.

As illustrated in FIG. 14, a semiconductor device 200 according to the second embodiment includes, among other things, a substrate 201, a nitride semiconductor layer 210, an insulating layer 121, an insulating layer 122S, an insulating layer 122D, an n-type GaN layer 231S, an n-type GaN layer 231D, a gate electrode 141, a source electrode 132S, a drain electrode 132D, and an insulating layer 142.

The substrate 201 can be a substrate for growing thereon a GaN-based semiconductor, for example, and an example of the substrate 201 includes a semi-insulating SiC substrate, for example. In a case where the substrate 201 is a SiC substrate, a surface of the substrate 201 is a silicon polar (Si-polar) surface. In a case where the surface of the substrate 201 is a Si-polar surface, crystal growth of the nitride semiconductor layer 210 can occur using the Ga-polar surface as a growth surface. A sapphire substrate can also be used as the substrate for growing thereon the GaN-based semiconductor.

The nitride semiconductor layer 210 includes a channel layer 211, a barrier layer 212, and a cap layer 213. The nitride semiconductor layer 210 is an example of the first nitride semiconductor layer.

The channel layer 211 can be a GaN layer, for example. The channel layer 211 has a thickness in a range greater than or equal to 200 nm and less than or equal to 2000 nm, for example, and is 1000 nm in one embodiment. A buffer layer can be provided between the channel layer 211 and the substrate 201.

The barrier layer 212 can be a AlGaN layer, for example. A band gap of the barrier layer 212 is larger than a band gap of the channel layer 211. The barrier layer 212 has a thickness in a range greater than or equal to 5 nm and less than or equal to 30 nm, for example, and is 15 nm in one embodiment. In the case where the barrier layer 212 is a $Al_xGa_{1-x}N$ layer, a Al composition x thereof is in a range greater than or equal to 0.15 and less than or equal to 0.35, for example, and is 0.25 in one embodiment. A strain is generated between the channel layer 211 and the barrier layer 212 due to a difference between lattice constants thereof, and this strain induces a piezoelectric charge at an interface between the channel layer 211 and the barrier layer 212. Hence, a 2DEG is generated in a region inside the channel layer 211, on a side closer to the barrier layer 212, to thereby form a channel region 211c. A InAlN layer or a InAlGaN layer can be used in place of the AlGaN layer. In addition, a spacer layer can be provided between the channel layer 211 and the barrier layer 212. The spacer layer can be a AlN layer, for example. The spacer layer has a thickness in a range greater than or equal to 0.5 nm and less than or equal to 3.0 nm, for example, and is 1.0 nm in one embodiment.

The cap layer 213 can be a GaN layer, for example. The cap layer 213 has a thickness in a range greater than or equal to 0 nm and less than or equal to 5 nm, for example, and is 2 nm in one embodiment. A surface of the cap layer 213 forms a surface 210A of the nitride semiconductor layer 210. The surface 210A is an example of the first principal face.

On the Si-polar surface of the SiC substrate, crystal growth of the channel layer 211, the barrier layer 212, and the cap layer 213 can occur using the Ga-polar surface as a growth surface. Accordingly, the surface of each of the channel layer 211, the barrier layer 212, and the cap layer 213 becomes a Ga-polar surface, and the back surface of each of the channel layer 211, the barrier layer 212, and the cap layer 213 on the opposite side becomes an N-polar surface.

Recesses 210S and 210D are formed in the nitride semiconductor layer 210. The recesses 210S and 210D are formed to a depth that penetrates the channel region 211c. In other words, the depth of the recesses 210S and 210D is greater than a depth of the channel region 211c, with reference to the surface 210A of the nitride semiconductor layer 210. Bottom surfaces of the recesses 210S and 210D can be located inside the barrier layer 212.

The insulating layer 121 makes contact with the surface 210A of the nitride semiconductor layer 210. The openings 121S and 121D are formed in the insulating layer 121. The opening 121S is connected to the recess 210S, and the opening 121D is connected to the recess 210D.

The n-type GaN layer 231S is formed on the nitride semiconductor layer 210 inside the recess 210S and the opening 121S. The n-type GaN layer 231D is famed on the nitride semiconductor layer 210 inside the recess 210D and the opening 121D. The n-type GaN layers 231S and 231D include Ge or Si as an n-type impurity. The n-type GaN layers 231S and 231D are examples of the second nitride semiconductor layer or the third nitride semiconductor layer.

The insulating layer 122S is formed on the n-type GaN layer 231S and the insulating layer 121. The insulating layer 122S makes contact with the boundary line 224S between the n-type GaN layer 231S and the insulating layer 121, and covers the boundary line 224S between the n-type GaN layer 231S and the insulating layer 121. The boundary line 224S is a line forming an interface between the n-type GaN layer 231S and the insulating layer 121, and is located at an end portion of the interface separated from the nitride semiconductor layer 210. The opening 123S, through which a portion of the n-type GaN layer 231S is exposed, is formed in the insulating layer 122S.

The insulating layer 122D is formed on the n-type GaN layer 231D and the insulating layer 121. The insulating layer 122D is separated from the insulating layer 122S. The insulating layer 122D makes contact with the boundary line 224D between the n-type GaN layer 231D and the insulating layer 121, and covers the boundary line 224D between the n-type GaN layer 231D and the insulating layer 121. The boundary line 224D is a line forming an interface between the n-type GaN layer 231D and the insulating layer 121, and is located at an end portion of the interface separated from the nitride semiconductor layer 210. The opening 123D, through which a portion of the n-type GaN layer 231D is exposed, is famed in the insulating layer 122D.

The source electrode 132S is formed on the insulating layer 122S, and the drain electrode 132D is formed on the insulating layer 122D. The source electrodes 132S makes contact with the n-type GaN layer 231S through the opening 123S, and the drain electrode 132D makes contact with the n-type GaN layer 231D through the opening 123D. The source electrode 132S makes an ohmic contact with the n-type GaN layer 231S, and the drain electrode 132D makes an ohmic contact with the n-type GaN layer 231D.

The insulating layer 142 is formed on the insulating layer 121. The insulating layer 142 covers the insulating layer 122S, the source electrode 132S, the insulating layer 122D, and the drain electrode 132D. In the plan view, an opening 121G is famed in the insulating layers 142 and 121 between the insulating layer 122S and the insulating layer 122D. A portion of the nitride semiconductor layer 210 is exposed through the opening 121G. The gate electrode 141 is formed on the insulating layer 142, so as to make contact with the nitride semiconductor layer 210 through the opening 121G. The gate electrode 141 makes a Schottky contact with the nitride semiconductor layer 210. The opening 121G is an example of a fifth opening.

Other configurations are the same as those of the first embodiment.

Next, a method for manufacturing the semiconductor device 200 according to the second embodiment will be described. FIG. 15 through FIG. 26 are cross sectional views illustrating the method for manufacturing the semiconductor device according to the second embodiment.

Figure 15:
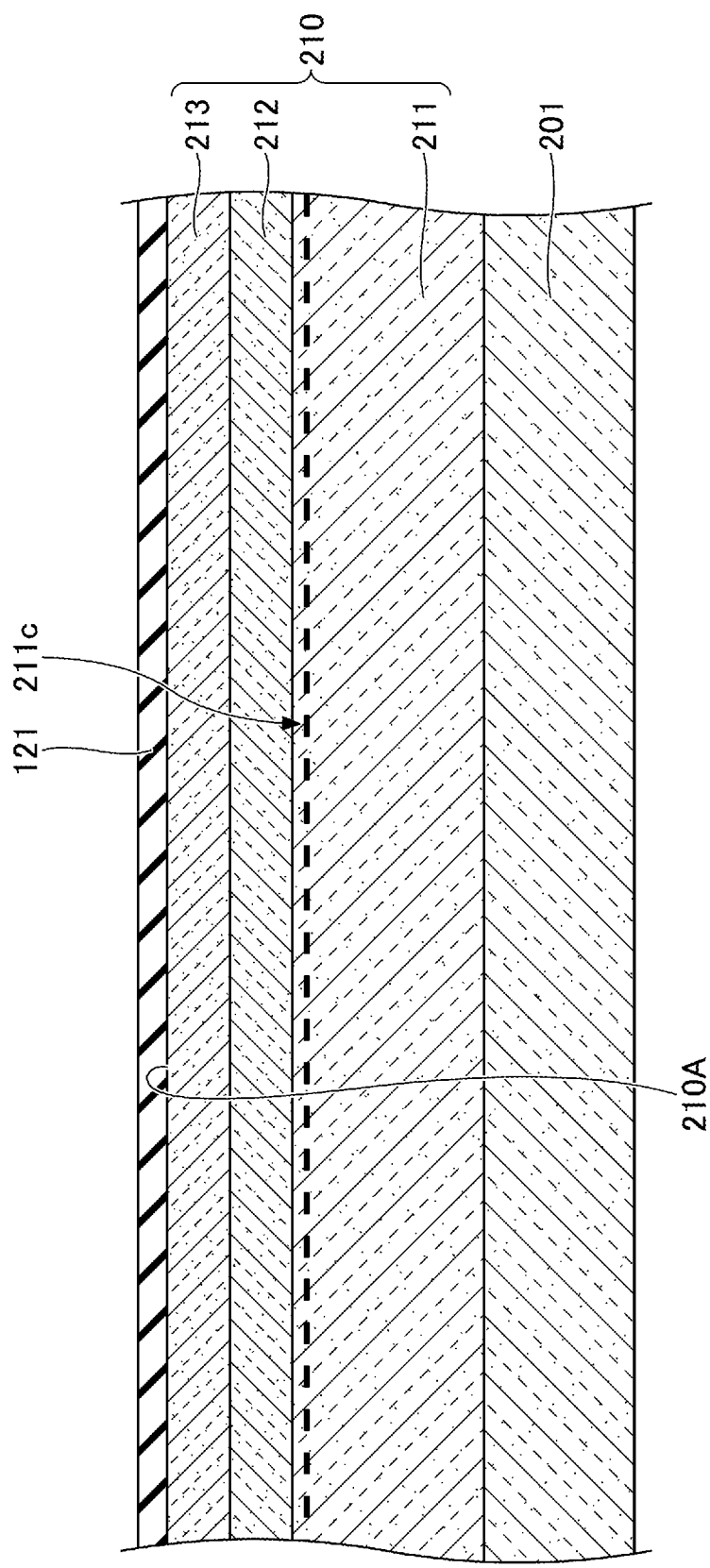
FIG. 15 is a cross sectional view (part 1) illustrating a method for manufacturing the semiconductor device according to the second embodiment.

First, as illustrated in FIG. 15, the nitride semiconductor layer 210 is formed on the substrate 201 by MOCVD, for example. When forming the nitride semiconductor layer 210, the channel layer 211, the barrier layer 212, and the cap layer 213 are successively formed in this order. A strain is generated between the channel layer 211 and the barrier layer 212 due to a difference between lattice constants thereof, and this strain induces a piezoelectric charge at an interface between the channel layer 211 and the barrier layer 212. Hence, a 2DEG is generated in a region inside the channel layer 211, on a side closer to the barrier layer 212, to thereby form the channel region 211c.

Next, the insulating layer 121, making contact with the surface 210A of the nitride semiconductor layer 210, is formed. The insulating layer 121 can be formed by LPCVD, for example. The insulating layer 121 can be formed continuously on the channel layer 211, the barrier layer 212, and the cap layer 213 by MOCVD, for example, without exposing the surface of the cap layer 213 to the atmosphere.

Figure 16:
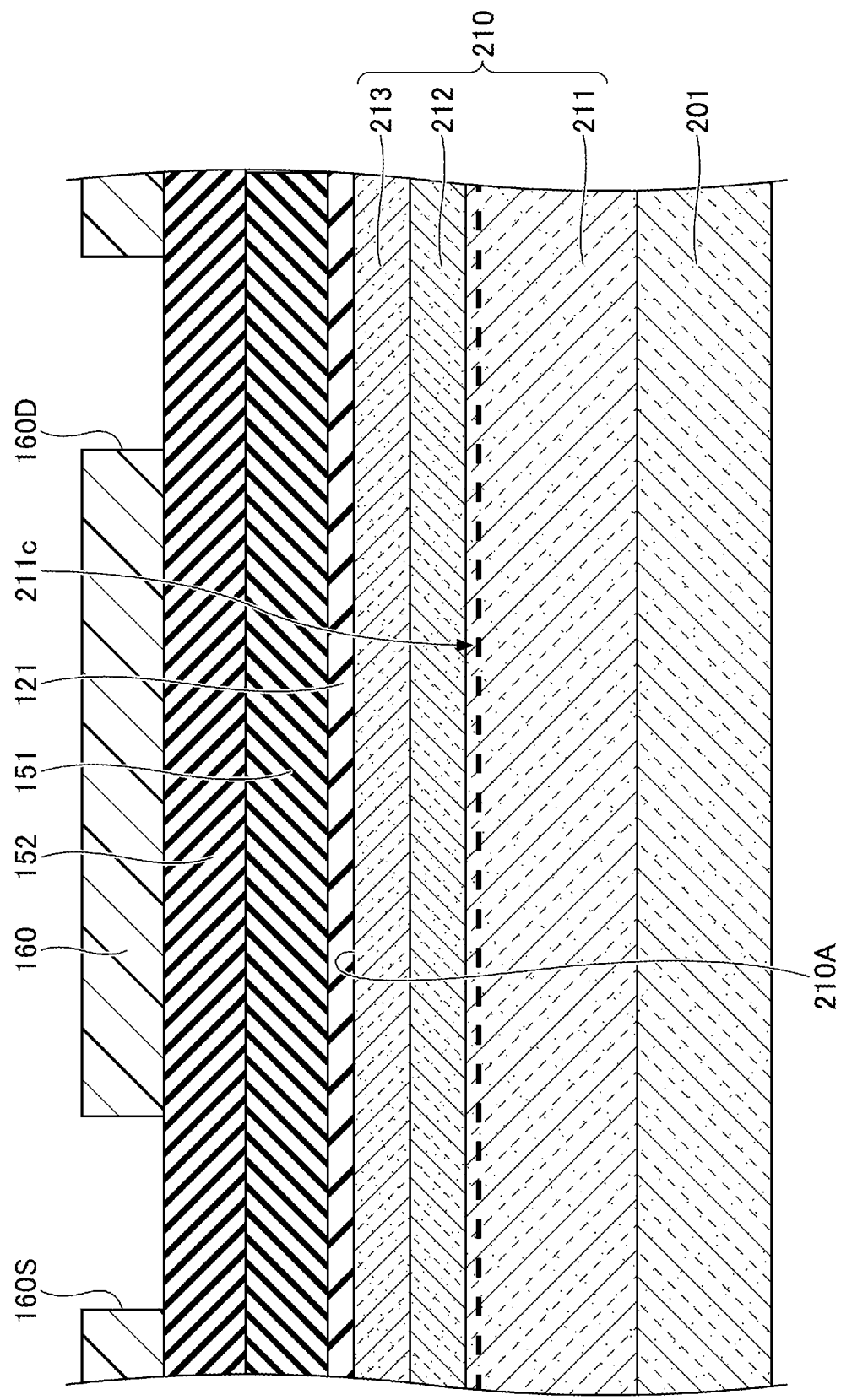
FIG. 16 is a cross sectional view (part 2) illustrating the method for manufacturing the semiconductor device according to the second embodiment.

Next, as illustrated in FIG. 16, the zinc oxide (ZnO) layer 151 is formed on the insulating layer 121. Next, the $Al_2O_3$ layer 152 is famed on the ZnO layer 151. Next, the resist pattern 160 is formed on the $Al_2O_3$ layer 152. The resist pattern 160 has the opening 160S for the source, and the opening 160D for the drain.

Figure 17:
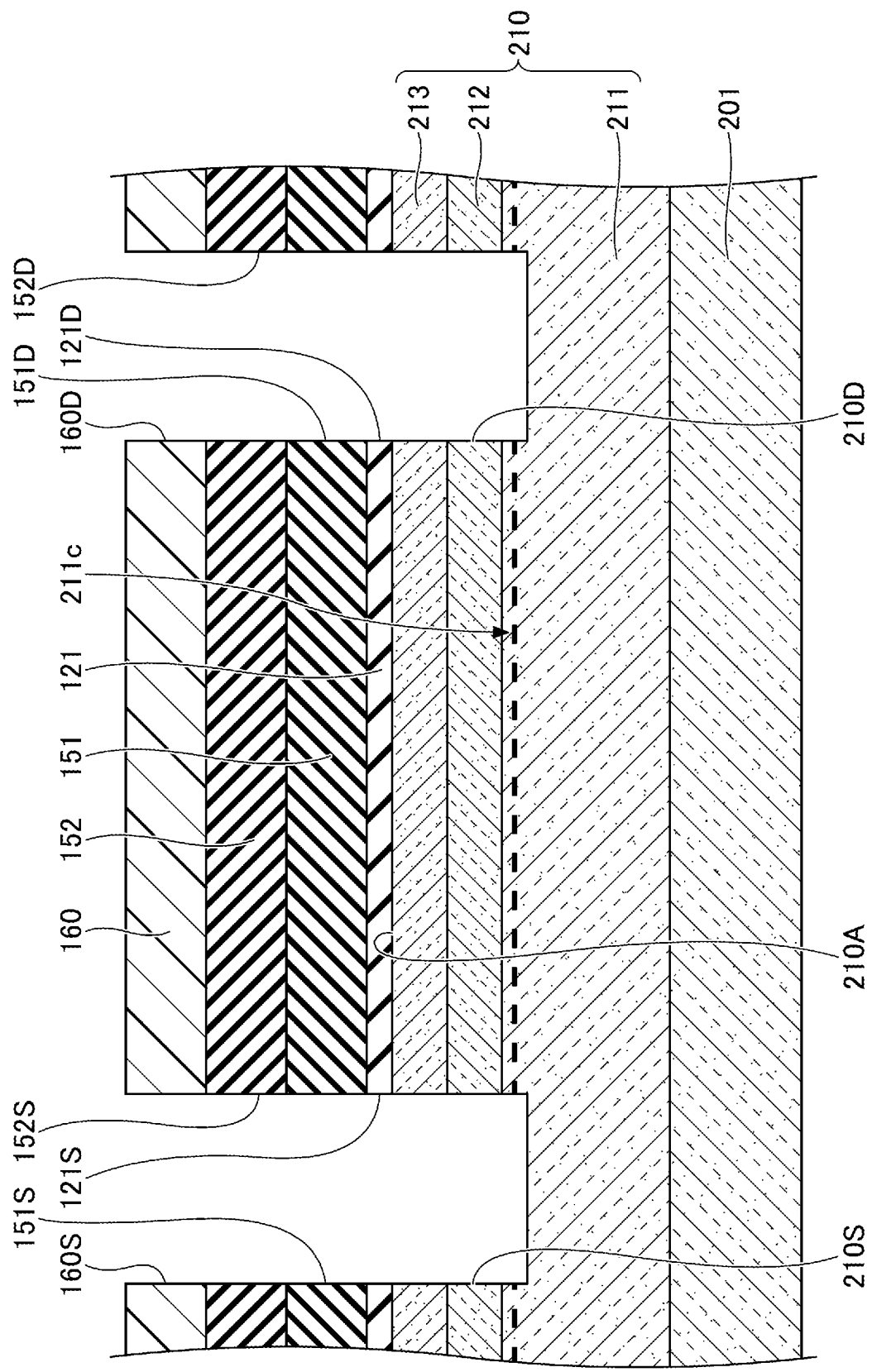
FIG. 17 is a cross sectional view (part 3) illustrating the method for manufacturing the semiconductor device according to the second embodiment.

Next, as illustrated in FIG. 17, the $Al_2O_3$ layer 152, the ZnO layer 151, and the insulating layer 121 are etched using the resist pattern 160 as a mask. As a result, under the opening 160S, the openings 152S, 151S, and 121S are famed in the $Al_2O_3$ layer 152, the ZnO layer 151, and the insulating layer 121, respectively. In addition, under the opening 160D, the openings 152D, 151D, and 121D are famed in the $Al_2O_3$ layer 152, the ZnO layer 151, and the insulating layer 121, respectively. A portion of the nitride semiconductor layer 210 is exposed through the openings 152S, 151S, and 121S, and another portion of the nitride semiconductor layer 210 is exposed through the openings 152D, 151D, and 121D.

Next, by etching the nitride semiconductor layer 210 using the resist pattern 160 as the mask, the recess 210S connecting to the openings 152S, 151S, and 121S, and the recess 210D connecting to the openings 152D, 151D, and 121D, are formed in the nitride semiconductor layer 210. This etching can be RIE using a chlorine-based gas, for example. This etching can be performed in a mixed gas atmosphere including hydrogen ($H_2$) and ammonia ($NH_3$). For example, the recesses 210S and 210D are formed to a depth that penetrates the channel region 211c. The recesses 210S and 210D can be formed to a depth that does not reach the channel region 211c.

Similar to the first embodiment, the $Al_2O_3$ layer 152 formed with the openings 152S and 152D, and the ZnO layer 151 formed with the openings 151S and 151D, can function as masks when etching the insulating layer 121. Accordingly, the resist pattern 160 can be removed before etching the insulating layer 121. The $Al_2O_3$ layer 152 formed with the openings 152S and 152D, and the ZnO layer 151 formed with the openings 151S and 151D, are examples of a mask. A combination of the openings 151S and 152S, and a combination of the openings 151D and 152D, are examples of a first mask opening or a second mask opening.

Figure 18:
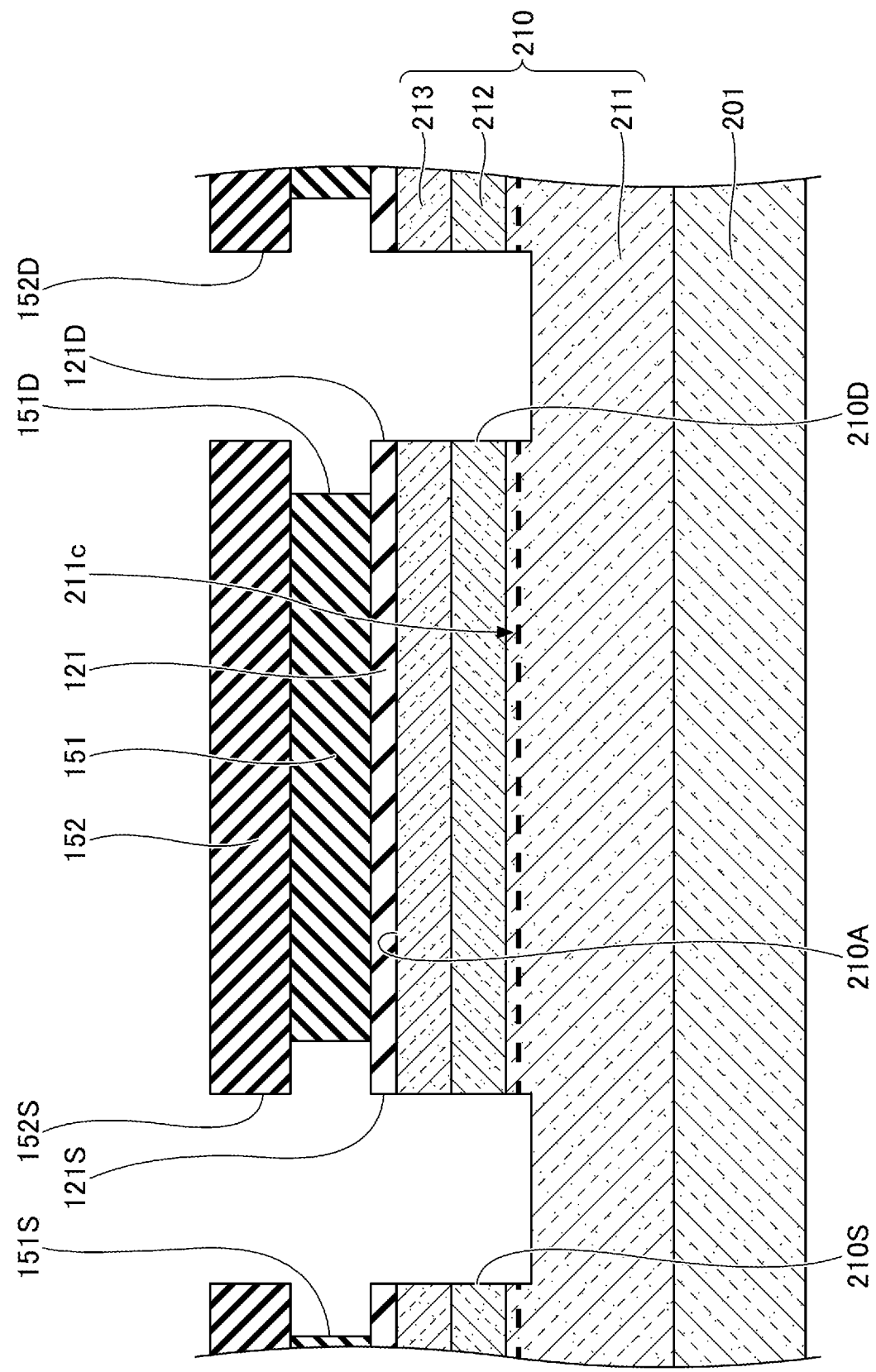
FIG. 18 is a cross sectional view (part 4) illustrating the method for manufacturing the semiconductor device according to the second embodiment.

Next, as illustrated in FIG. 18 and similar to the first embodiment, the resist pattern 160 is removed using a chemical solution, and the openings 151S and 151D are widened.

Figure 19:
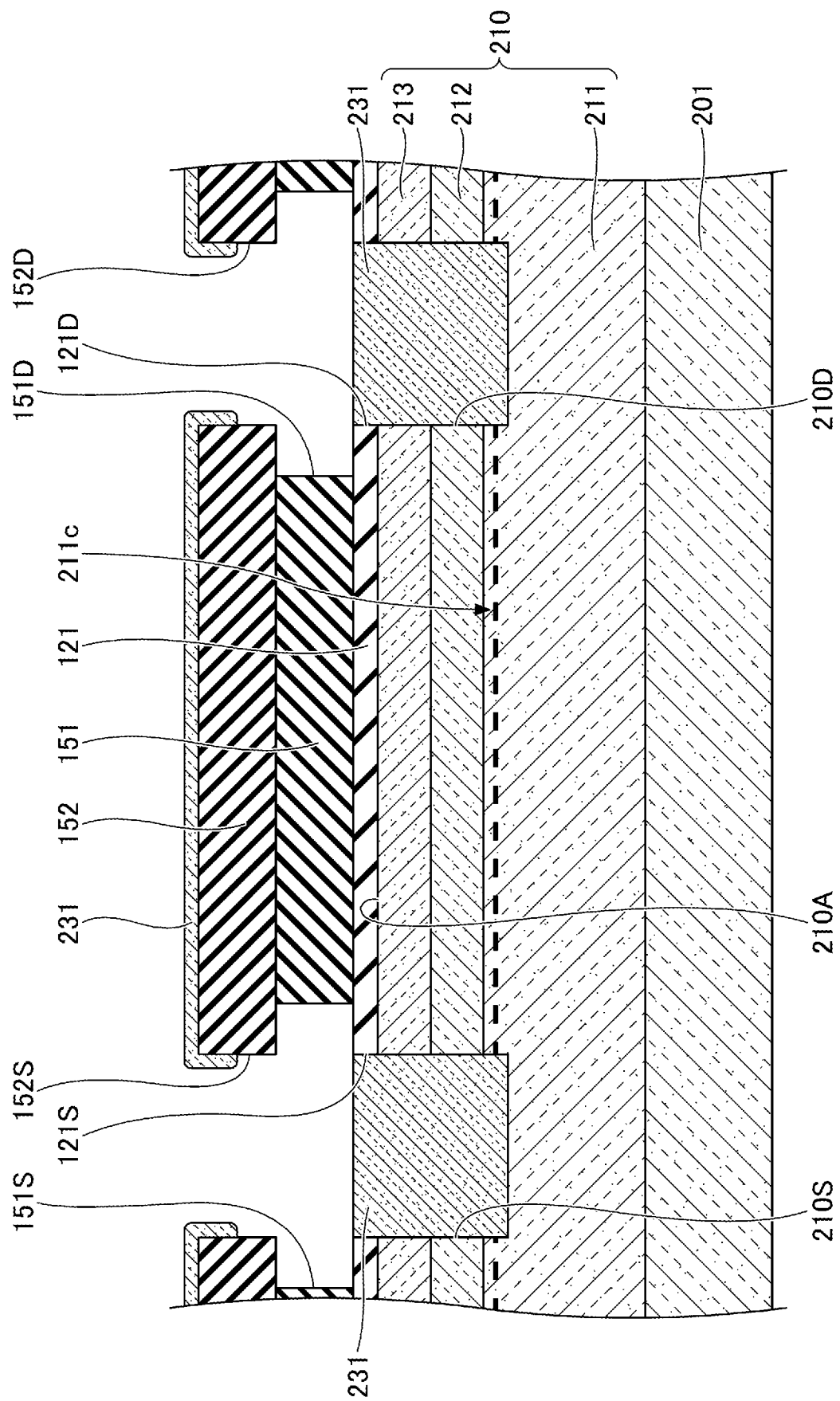
FIG. 19 is a cross sectional view (part 5) illustrating the method for manufacturing the semiconductor device according to the second embodiment.

Next, as illustrated in FIG. 19, the n-type GaN layer 231 is famed on the surface of the nitride semiconductor layer 210 exposed through the openings 152S, 151S, and 121S, and on the surface of the nitride semiconductor layer 210 exposed through the openings 152D, 151D, and 121D. An upper surface of the n-type GaN layer 231 can coincide or not coincide with the upper surface of the insulating layer 121. The n-type GaN layer 231 can be formed by sputtering, MOCVD, MBE, or the like, for example. In this state, the n-type GaN layer 231 is deposited not only on the nitride semiconductor layer 210, but also on the $Al_2O_3$ layer 152. For example, a concentration of the n-type dopant is greater than or equal to $1\times10^{17}$ $cm^{-3}$, and the n-type dopant can be Si or Ge.

On the Ga-polar surface of the nitride semiconductor layer 210, crystal growth of the n-type GaN layer 231 occurs using the Ga-polar surface as a growth surface. Accordingly, on the Ga-polar surface of the nitride semiconductor layer 210, the surface of the n-type GaN layer 231 becomes the Ga-polar surface, and the back surface the n-type GaN layer 231 on the opposite side becomes the N-polar surface.

Figure 20:
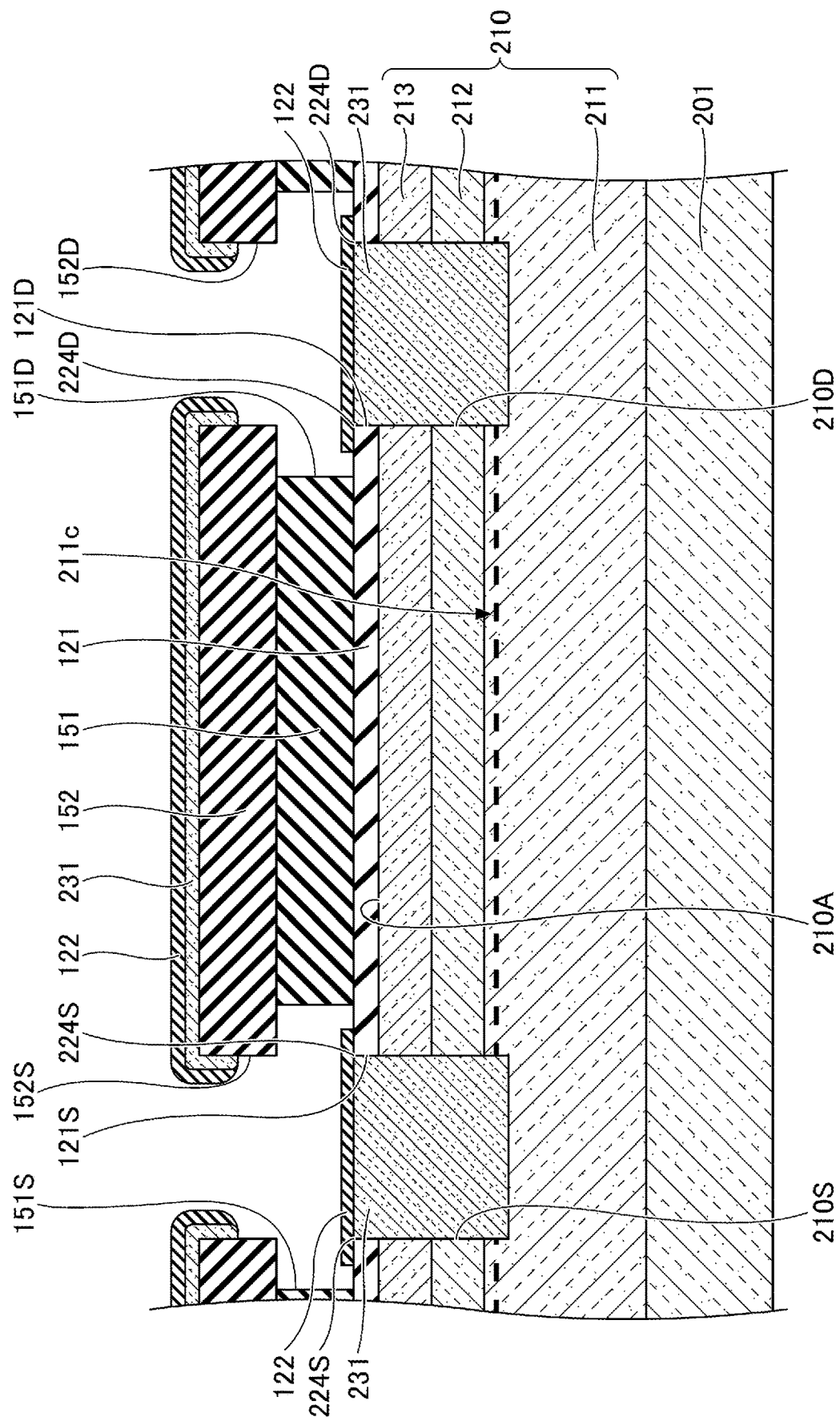
FIG. 20 is a cross sectional view (part 6) illustrating the method for manufacturing the semiconductor device according to the second embodiment.

Next, as illustrated in FIG. 20, the insulating layer 122 is famed on the surfaces of the insulating layer 121 and the n-type GaN layer 231 exposed through the openings 152S, 151S, and 121S and on the surfaces of the insulating layer 121 and the n-type GaN layer 231 exposed through the openings 152D, 151D, and 121D. The insulating layer 122 is famed so as to cover the boundary line 224S between the n-type GaN layer 231 and the insulating layer 121, and the boundary line 224D between the n-type GaN layer 231 and the insulating layer 121. In this state, the insulating layer 122 is also deposited on the n-type GaN layer 231 on the Al$_2$O$_3$ layer 152.

The n-type GaN layer 231 and the insulating layer 122 can be formed continuously using the same film forming apparatus.

Figure 21:
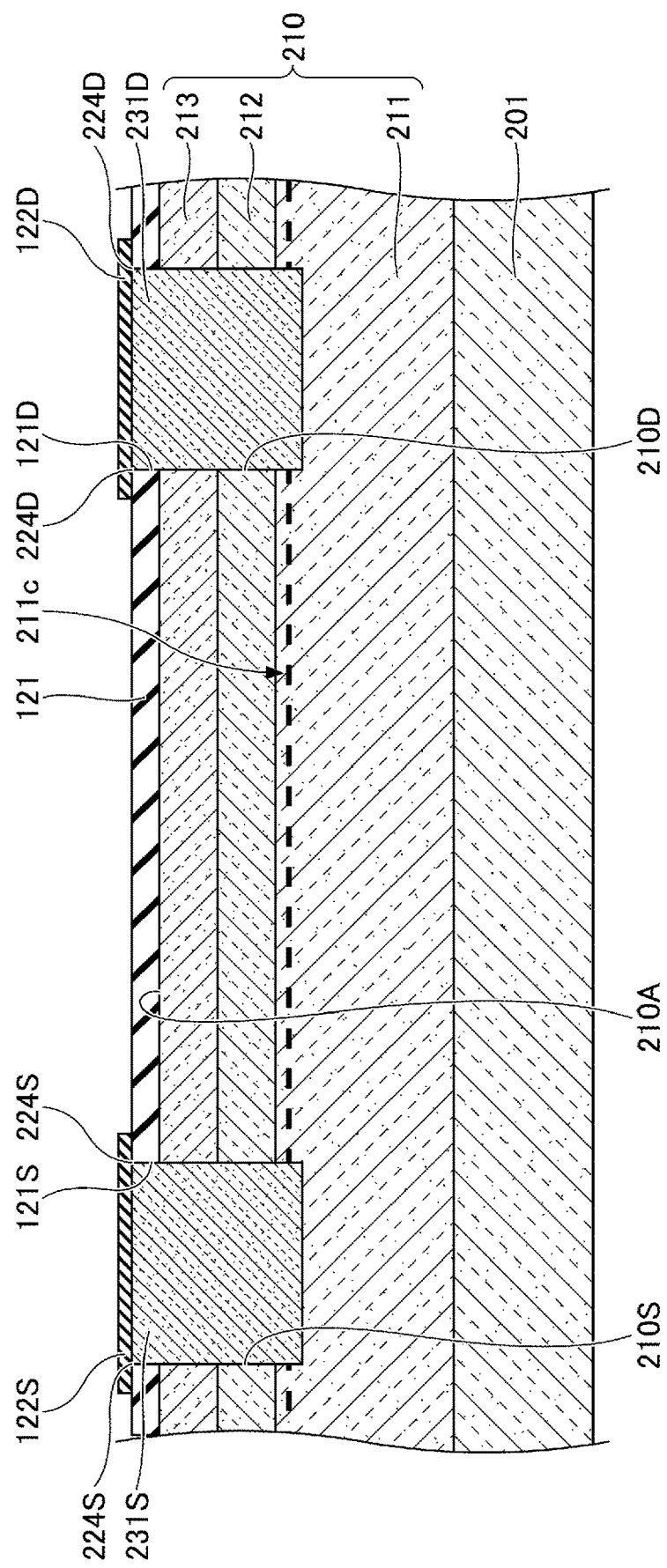
FIG. 21 is a cross sectional view (part 7) illustrating the method for manufacturing the semiconductor device according to the second embodiment.

Next, as illustrated in FIG. 21, the ZnO layer 151 is removed using an acid solution. The Al$_2$O$_3$ layer 152, the n-type GaN layer 231, and the insulating layer 122 on the ZnO layer 151 are also removed, along with the removal of the ZnO layer 151. As a result, the n-type GaN layer 231 remains inside the opening 121S, the recess 210S, the opening 121D, and the recess 210D, the n-type GaN layer 231S is formed inside the opening 121S and the recess 210S, and the n-type GaN layer 231D is formed inside the opening 121D and the recess 210D. In addition, the insulating layer 122 remains on the insulating layer 121 and the n-type GaN layer 231S and on the insulating layer 121 and the n-type GaN layer 231D, the insulating layer 122S is formed on the insulating layer 121 and the n-type GaN layer 231S, and the insulating layer 122D is formed on the insulating layer 121 and the n-type GaN layer 231D.

Figure 22:
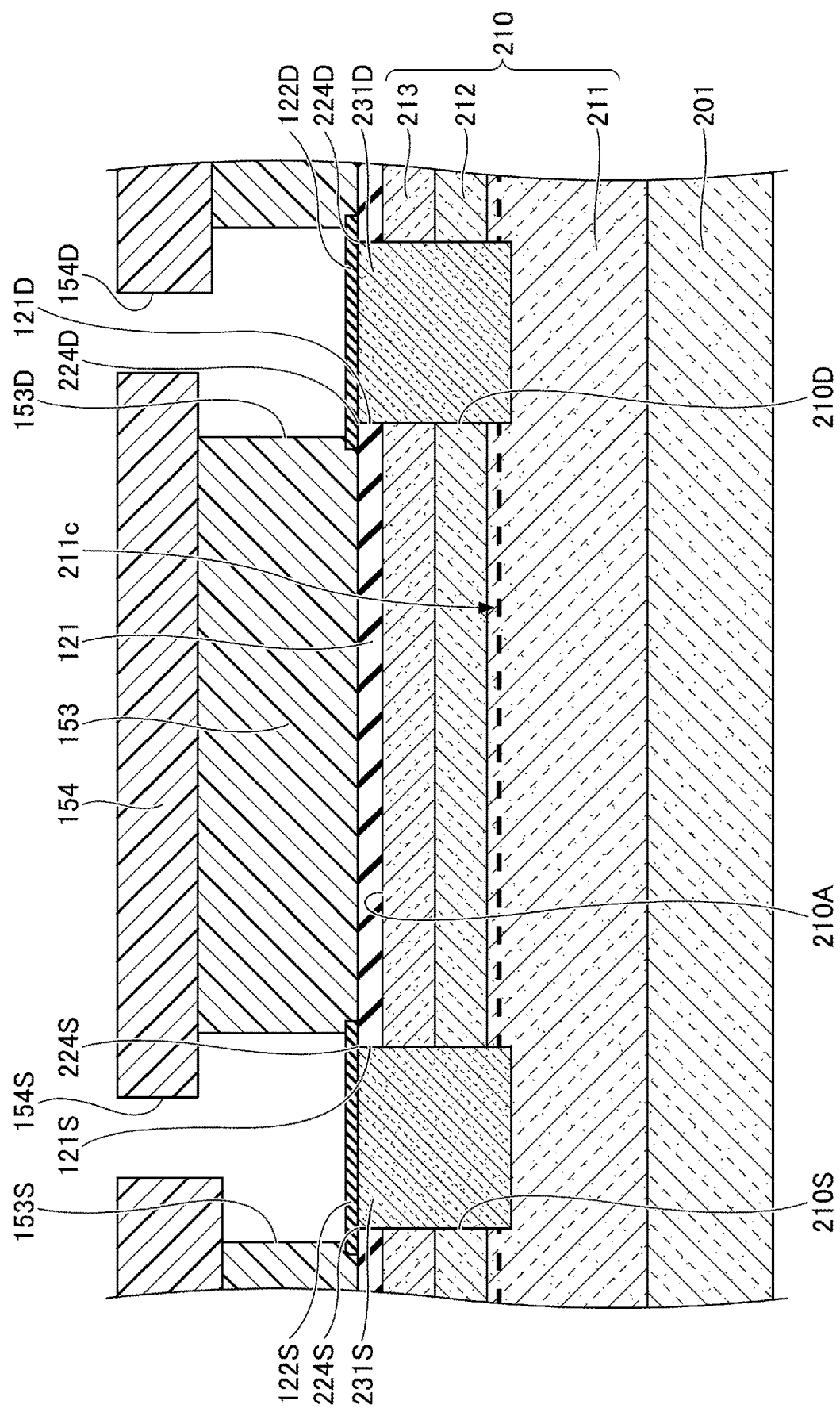
FIG. 22 is a cross sectional view (part 8) depicting the method for manufacturing the semiconductor device according to the second embodiment.

Next, as illustrated in FIG. 22 and similar to the first embodiment, the photoresist 153 and the photoresist 154 are coated in this order on the insulating layer 121, the insulating layer 122S, and the insulating layer 122D. Next, the opening 154S for the source and the opening 154D for the drain are formed in the photoresist 154, and the opening 153S for the source and the opening 153D for the drain are formed in the photoresist 153.

Figure 23:
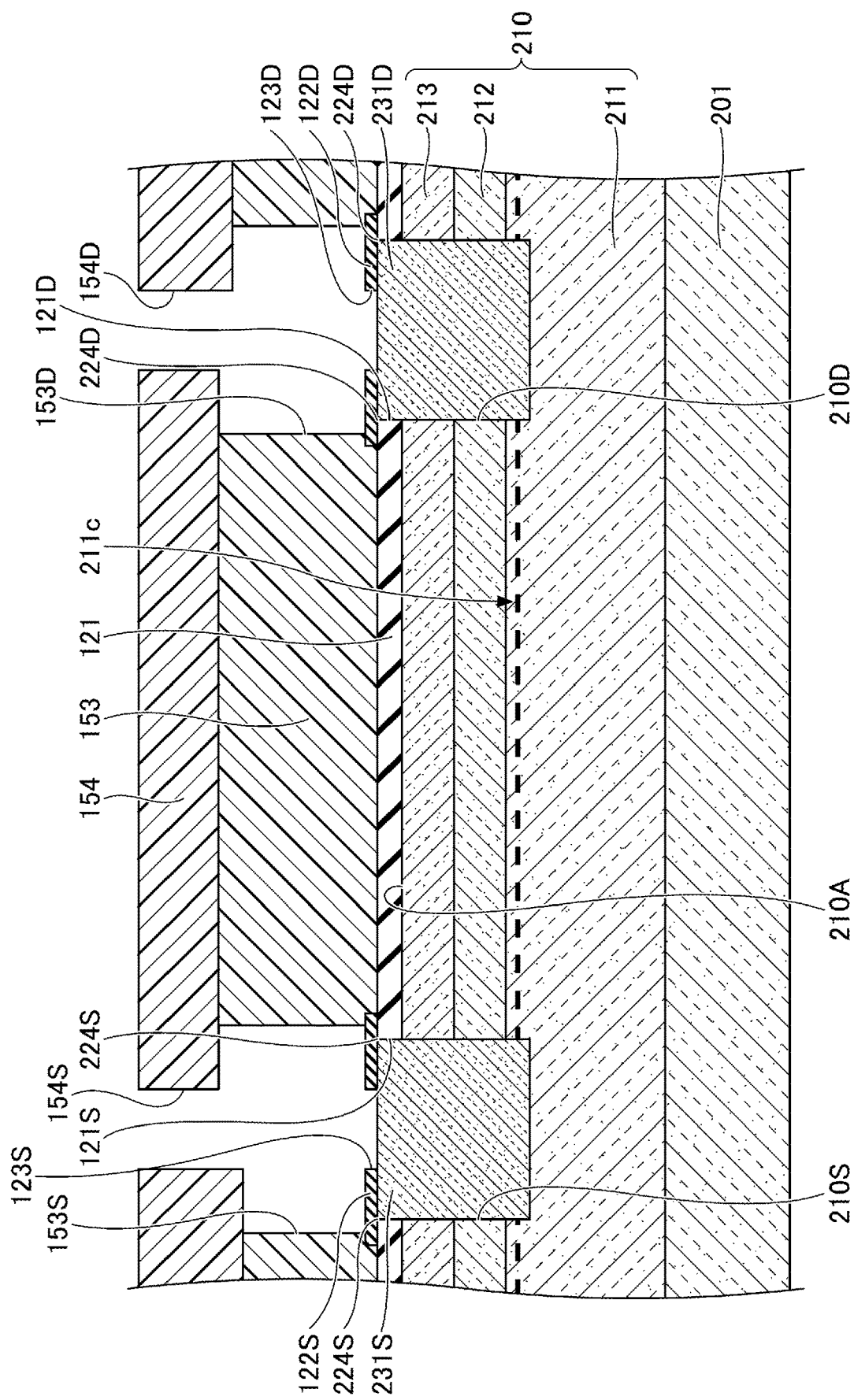
FIG. 23 is a cross sectional view (part 9) illustrating the method for manufacturing the semiconductor device according to the second embodiment.

Next, as illustrated in FIG. 23, the source opening 123S is formed in the insulating layer 122S and the drain opening 123D is formed in the insulating layer 122D, by etching using the photoresists 153 and 154 as masks. This etching can be RIE using a fluorine-based gas, for example. A portion of the n-type GaN layer 231S is exposed through the opening 123S, and a portion of the n-type GaN layer 231D is exposed through the opening 123D.

Figure 24:
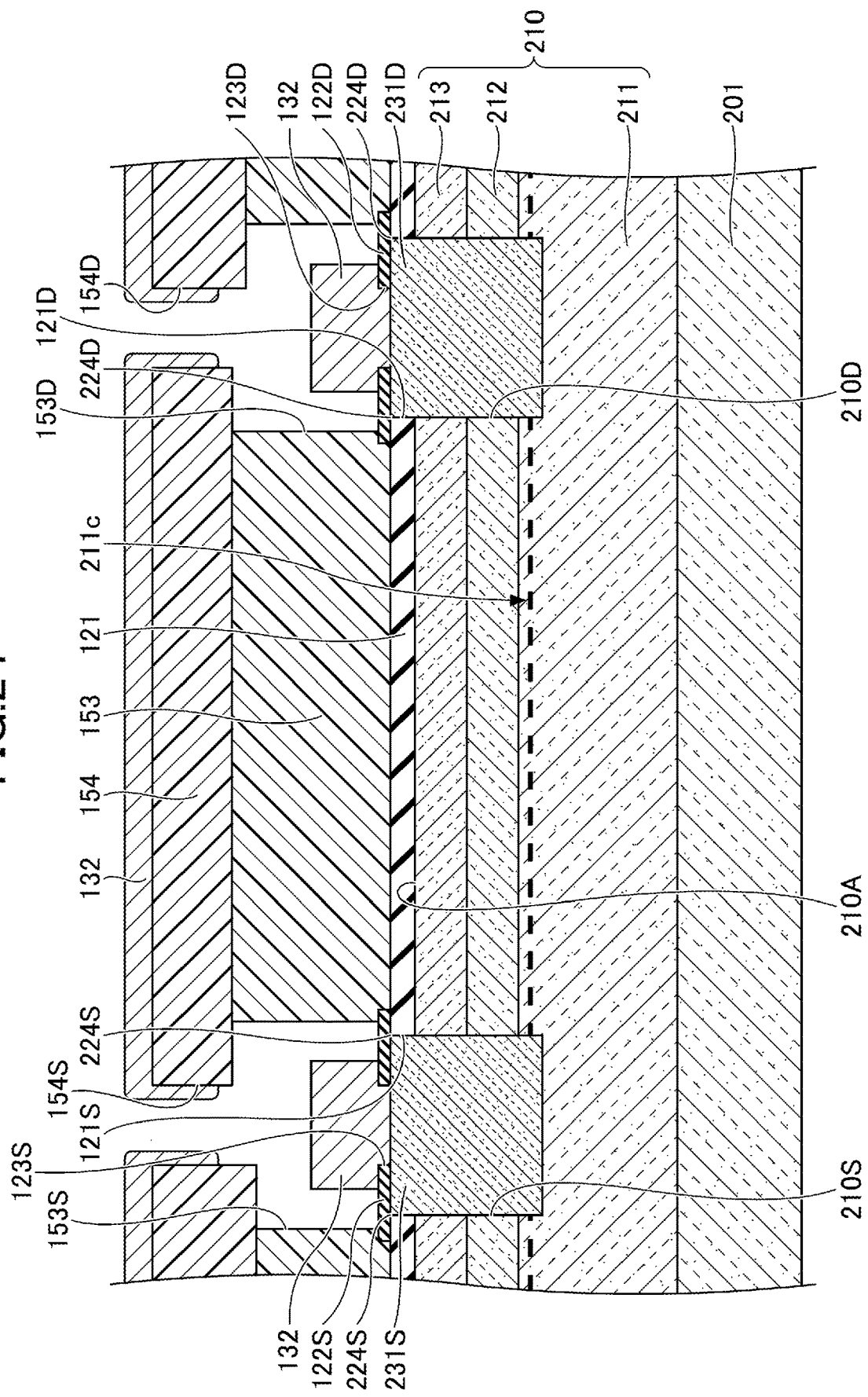
FIG. 24 is a cross sectional view (part 10) illustrating the method for manufacturing the semiconductor device according to the second embodiment.

Next, as illustrated in FIG. 24 and similar to the first embodiment, the metallic layer 132 is famed on the surfaces of the insulating layer 122S and the n-type GaN layer 231S exposed through the openings 154S and 153S and on the surfaces of the insulating layer 122D and the n-type GaN layer 231D exposed through the openings 154D and 153D. In this state, the metallic layer 132 is deposited not only on the insulating layer 122S, the n-type GaN layer 231S, the insulating layer 122D, and the n-type GaN layer 231D, but also on the photoresist 154.

Figure 25:
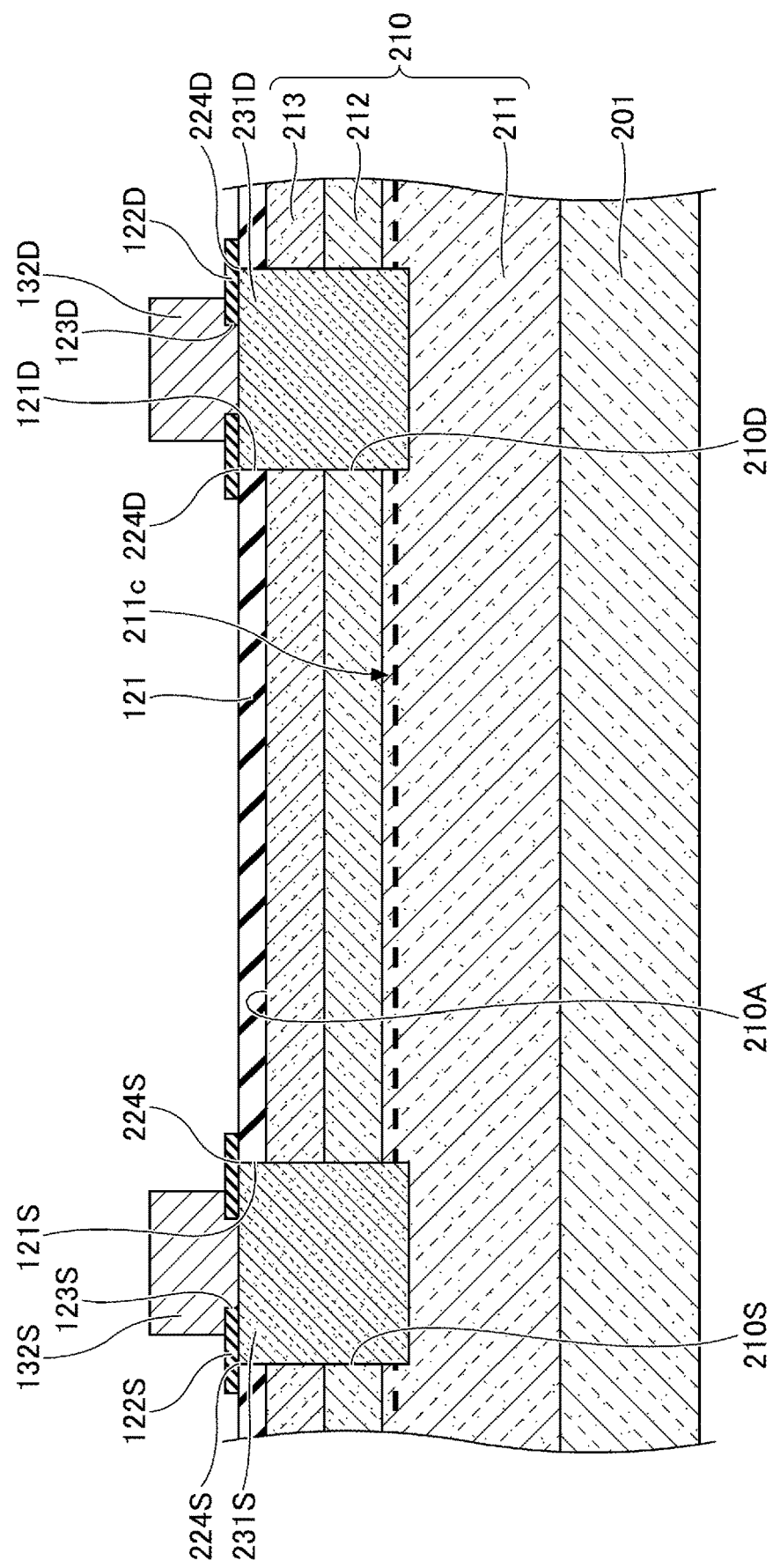
FIG. 25 is a cross sectional view (part 11) depicting the method for manufacturing the semiconductor device according to the second embodiment.

Next, as illustrated in FIG. 25, the photoresists 153 and 154 are removed. The metallic layer 132 on the photoresist 154 is also removed, along with the removal of the photoresist 154. As a result, the metallic layer 132 remains inside the opening 153S and the 153D. In other words, a lift-off is performed. Next, the metallic layer 132 is alloyed by a heat treatment. As a result, the source electrode 123S making contact with the n-type GaN layer 231S through the opening 123S is formed on the insulating layer 122S, and the drain electrode 132D making contact with the n-type GaN layer 231D through the opening 123D is famed on the insulating layer 122D. The source electrode 132S makes an ohmic contact with the n-type GaN layer 231S, and the drain electrode 132D makes an ohmic contact with the n-type GaN layer 231D.

Figure 26:
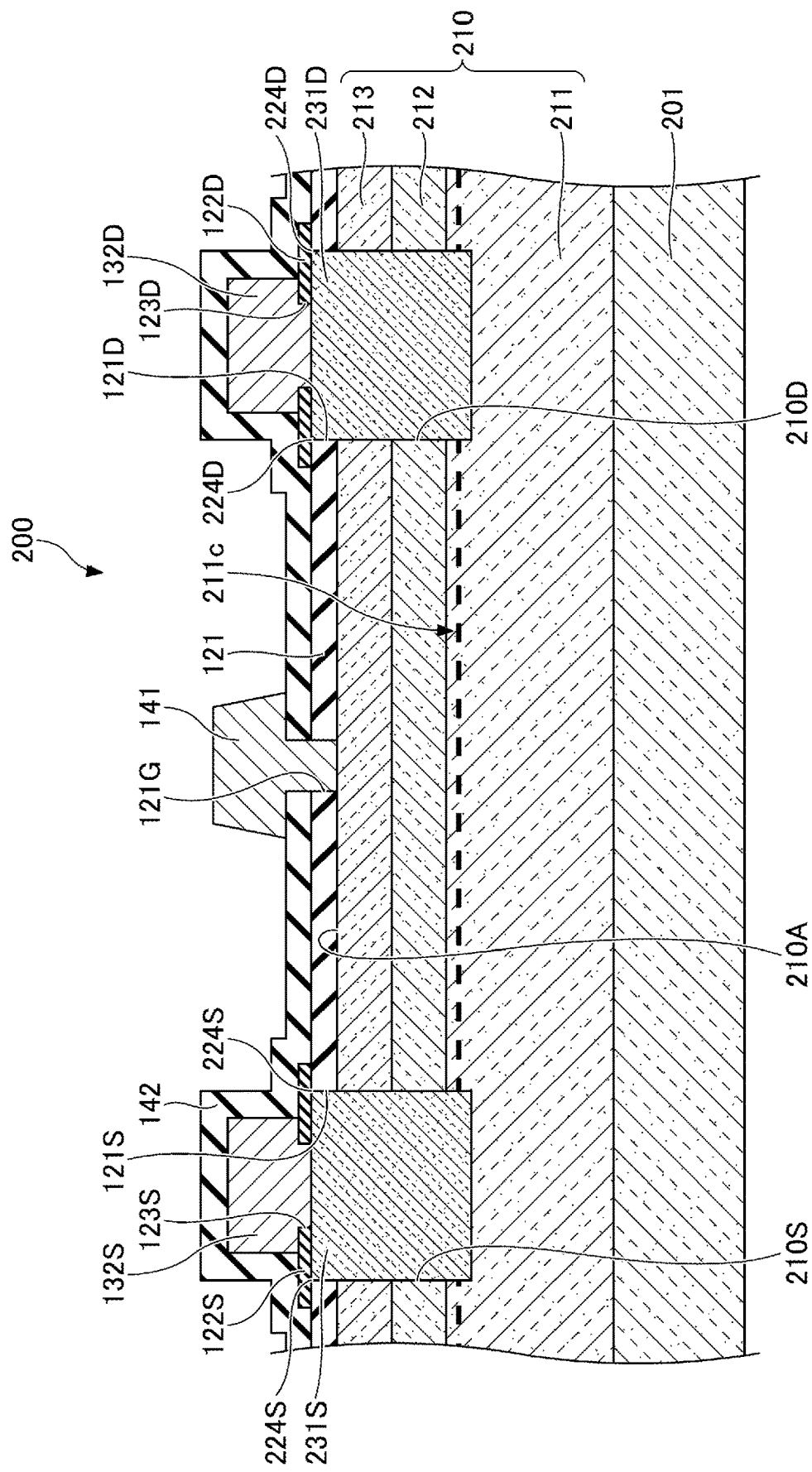
FIG. 26 is a cross sectional view (part 12) illustrating the method for manufacturing the semiconductor device according to the second embodiment.

Next, as illustrated in FIG. 26 and similar to the first embodiment, the insulating layer 142 is formed on the insulating layer 121. Next, the opening 121G is formed in the insulating layers 142 and 121 between the insulating layer 122S and the insulating layer 122D in the plan view. A portion of the nitride semiconductor layer 210 is exposed through the opening 121G. Next, the gate electrode 141, making contact with the nitride semiconductor layer 210 through the opening 121G, is formed. The gate electrode 141 can be formed by the same method as the first embodiment.

The semiconductor device 200 can be manufactured in the manner described above.

In the semiconductor device 200 according to the second embodiment, the n-type GaN layers 231S and 231D are covered with the insulating layer 122 before the ZnO layer 151 and the Al$_2$O$_3$ layer 152 serving as the masks are removed. The portion of the insulating layer 122 that becomes the insulating layer 122S makes contact with the boundary line 224S between the n-type GaN layer 231S and the insulating layer 121, and covers the boundary line 224S between the n-type GaN layer 231S and the insulating layer 121. The portion of the insulating layer 122 that becomes the insulating layer 122D makes contact with the boundary line 224D between the n-type GaN layer 231D and the insulating layer 121, and covers the boundary line 224D between the n-type GaN layer 231D and the insulating layer 121. Accordingly, the surfaces of the n-type GaN layers 231S and 231D are protected from the chemical solution used to remove the ZnO layer 151 and the Al$_2$O$_3$ layer 152, and damage to the surfaces of the n-type GaN layers 231S and 231D can be reduced.

Further, similar to the first embodiment, a distance between the gate electrode 141 and the nitride semiconductor layer 210 is hardly affected by the insulating layers 122S and 122D. Accordingly, a change in gate controllability from a structure having no insulating layers 122S and 122D can be reduced.

In the second embodiment, the upper surfaces of the n-type GaN layers 231S and 231D are Ga-polar surfaces. For this reason, an excellent etching resistance can easily be obtained at the upper surfaces of the n-type GaN layers 231S and 231D.

Moreover, the gate electrode 141 makes contact with the nitride semiconductor layer 210 through the opening 121G. For this reason, the so-called MES structure can be formed.

Although the embodiments are described above in detail, the present disclosure is not limited to specific embodiments, and various variations, modifications, and substitutions can be made without departing from the scope of the present invention.

According to the present disclosure, it is possible to reduce damage to a surface of a regrown nitride semiconductor layer.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method for manufacturing a semiconductor device, comprising:
   forming a first insulating layer on a first nitride semiconductor layer having a first principal surface;
   forming, on the first insulating layer, a mask including a first mask opening through which a portion of the first insulating layer is exposed;
   forming a first opening in the first insulating layer through the first mask opening, to expose a portion of the first nitride semiconductor layer;
   forming a second nitride semiconductor layer on the first nitride semiconductor layer inside the first opening, through the first mask opening;
   forming a second insulating layer covering a boundary line between the second nitride semiconductor layer and the first insulating layer, through the first mask opening;
   removing the mask after the forming the second insulating layer;
   forming a second opening in the second insulating layer, to expose a portion of the second nitride semiconductor layer;
   forming a first electrode on the second insulating layer, making contact with the second nitride semiconductor layer through the second opening; and
   forming a gate electrode above the first nitride semiconductor layer, at a position separated from the second insulating layer in a plan view perpendicular to the first principal surface.

2. The method for manufacturing the semiconductor device as claimed in claim 1, wherein the mask includes a second mask opening through which another portion of the first insulating layer is exposed, the method further comprising:
   forming a third opening in the first insulating layer through the second mask opening, to expose another portion of the first nitride semiconductor layer, simultaneously as the forming of the first opening;
   forming a third nitride semiconductor layer on the first nitride semiconductor layer inside the third opening through the second mask opening, simultaneously as the forming the second nitride semiconductor layer;
   forming a third insulating layer covering a boundary line between the third nitride semiconductor layer and the first insulating layer through the second mask opening, simultaneously as the forming of the second insulating layer;
   forming a fourth opening in the third insulating layer, to expose a portion of the third nitride semiconductor layer, simultaneously as the forming the second opening; and
   forming a second electrode on the third insulating layer, making contact with the third nitride semiconductor layer through the fourth opening, simultaneously as the forming the first electrode.

3. The method for manufacturing the semiconductor device as claimed in claim 2, wherein the gate electrode is formed between the second insulating layer and the third insulating layer in the plan view.

4. The method for manufacturing the semiconductor device as claimed in claim 2, further comprising:
   forming a fourth insulating layer on the first insulating layer and covering the first electrode, between the forming the first electrode and the forming the gate electrode,
   wherein the gate electrode is formed on the fourth insulating layer.

5. The method for manufacturing the semiconductor device as claimed in claim 4, wherein an upper surface of the second nitride semiconductor layer is an N-polar surface.

6. The method for manufacturing the semiconductor device as claimed in claim 4, further comprising:
   forming a fifth opening in the fourth insulating layer and the first insulating layer, between the forming the fourth insulating layer and the forming the gate electrode,
   wherein the gate electrode is formed to make contact with the first nitride semiconductor layer through the fifth opening.

7. The method for manufacturing the semiconductor device as claimed in claim 6, wherein an upper surface of the second nitride semiconductor layer is a Ga-polar surface.

8. A semiconductor device comprising:
   a first nitride semiconductor layer having a first principal surface;
   a first insulating layer provided on the first nitride semiconductor layer and having a first opening exposing a portion of the first nitride semiconductor layer;
   a second nitride semiconductor layer provided on the first nitride semiconductor layer inside the first opening;
   a second insulating layer covering a boundary line between the second nitride semiconductor layer and the first insulating layer, and having a second opening exposing a portion of the second nitride semiconductor layer;
   an electrode provided on the second insulating layer and making contact with the second nitride semiconductor layer through the second opening; and
   a gate electrode provided above the first nitride semiconductor layer, and separated from the second insulating layer in a plan view perpendicular to the first principal surface.

* * * * *